(12) United States Patent
Oikawa et al.

(10) Patent No.: US 9,006,051 B2
(45) Date of Patent: Apr. 14, 2015

(54) SEMICONDUCTOR DEVICE AND METHOD FOR MANUFACTURING THE SAME

(75) Inventors: Yoshiaki Oikawa, Tochigi (JP);
Masayuki Kajiwara, Tochigi (JP);
Masataka Nakada, Tochigi (JP);
Masami Jintyou, Tochigi (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 972 days.

(21) Appl. No.: 12/423,563

(22) Filed: Apr. 14, 2009

(65) Prior Publication Data

US 2009/0261414 A1    Oct. 22, 2009

(30) Foreign Application Priority Data

Apr. 18, 2008    (JP) ................................ 2008-109119

(51) Int. Cl.
| | |
|---|---|
| *H01L 21/56* | (2006.01) |
| *H01L 21/336* | (2006.01) |
| *H01L 27/12* | (2006.01) |
| *H01L 23/31* | (2006.01) |

(52) U.S. Cl.
CPC .......... *H01L 27/1266* (2013.01); *H01L 21/568* (2013.01); *H01L 23/3107* (2013.01); *H01L 23/3114* (2013.01); *H01L 27/1214* (2013.01); *H01L 2924/12044* (2013.01); *H01L 2924/19041* (2013.01); *H01L 2924/0002* (2013.01)

(58) Field of Classification Search
CPC .................................................... H01L 21/568
USPC ................................................. 438/151, 462
See application file for complete search history.

(56) References Cited

U.S. PATENT DOCUMENTS

| | | | |
|---|---|---|---|
| 6,897,932 B2 * | 5/2005 | Murade et al. | ................ 349/151 |
| 7,060,153 B2 | 6/2006 | Yamazaki et al. | |
| 7,282,380 B2 | 10/2007 | Maruyama et al. | |
| 7,487,373 B2 | 2/2009 | Koyama | |
| 7,700,463 B2 | 4/2010 | Shimomura | |
| 7,862,677 B2 | 1/2011 | Nakajima et al. | |
| 2003/0171001 A1 | 9/2003 | Shinohara | |
| 2006/0139505 A1 | 6/2006 | Yoshinaga | |
| 2007/0072439 A1 | 3/2007 | Akimoto et al. | |

(Continued)

FOREIGN PATENT DOCUMENTS

| | | |
|---|---|---|
| JP | 06-130374 A | 5/1994 |
| JP | 09-033933 A | 2/1997 |

(Continued)

*Primary Examiner* — Olik Chaudhuri
*Assistant Examiner* — Christine Enad
(74) *Attorney, Agent, or Firm* — Husch Blackwell LLP

(57) ABSTRACT

An object is to improve water resistance and reliability of a semiconductor device by reducing the degree of peeling of a film. In a semiconductor device, a first inorganic insulating layer, a semiconductor element layer, a second inorganic insulating layer, an organic insulating layer, and a third inorganic insulating layer are sequentially stacked over a substrate. The second inorganic insulating layer is in contact with the first inorganic insulating layer in an opening portion provided in the semiconductor element layer. The third inorganic insulating layer is in contact with the second inorganic insulating layer in an opening portion provided in the organic insulating layer. In a region where the second inorganic insulating layer and the third inorganic insulating layer are in contact with each other, the second inorganic insulating layer has a plurality of irregularities or openings.

10 Claims, 16 Drawing Sheets

(56) References Cited

U.S. PATENT DOCUMENTS

| | | |
|---|---|---|
| 2007/0196999 A1* | 8/2007 | Tamura et al. ............... 438/458 |
| 2007/0232005 A1* | 10/2007 | Maruyama et al. ........... 438/299 |
| 2007/0292997 A1 | 12/2007 | Maruyama et al. |
| 2008/0044940 A1 | 2/2008 | Watanabe et al. |
| 2008/0093464 A1 | 4/2008 | Dairiki et al. |
| 2008/0224941 A1 | 9/2008 | Sugiyama et al. |
| 2008/0242005 A1 | 10/2008 | Dozen et al. |
| 2008/0303140 A1 | 12/2008 | Ohtani et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0057875 A1 | 3/2009 | Aoki et al. |
| 2009/0227088 A1* | 9/2009 | Kida et al. ................... 438/462 |

FOREIGN PATENT DOCUMENTS

| | | |
|---|---|---|
| JP | 2001-272923 A | 10/2001 |
| JP | 2005-311342 | 11/2005 |
| JP | 2006-178368 A | 7/2006 |
| JP | 2007-096275 A | 4/2007 |
| JP | 2007-096281 A | 4/2007 |

* cited by examiner

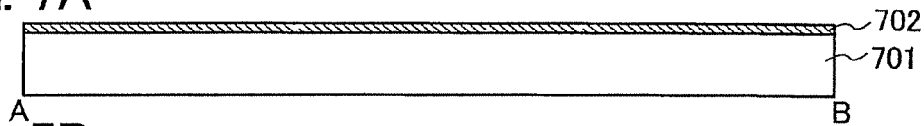
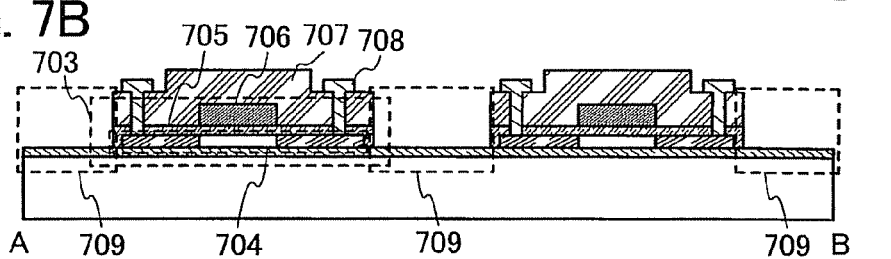
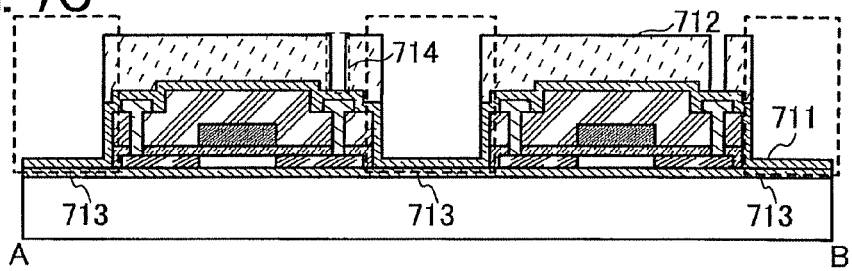
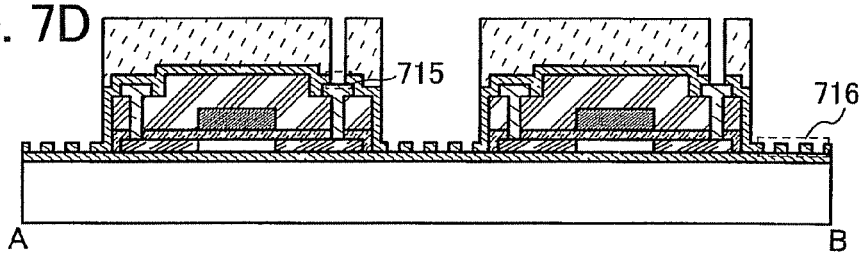
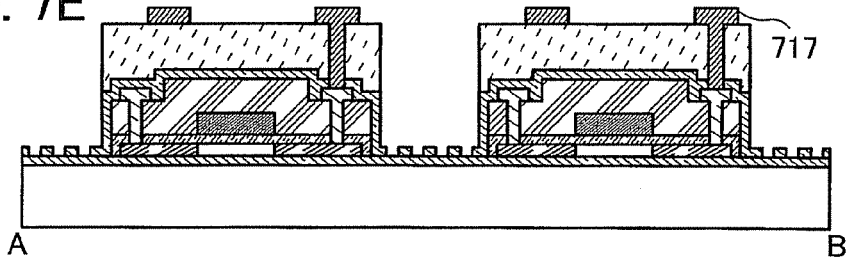
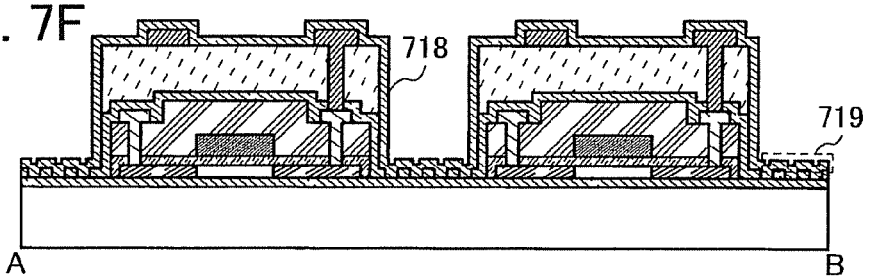

FIG. 13A
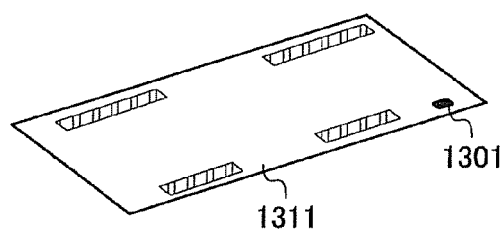
FIG. 13B
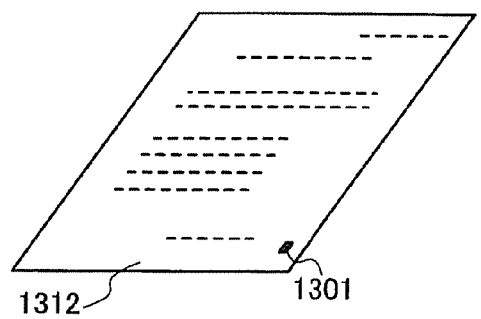
FIG. 13C
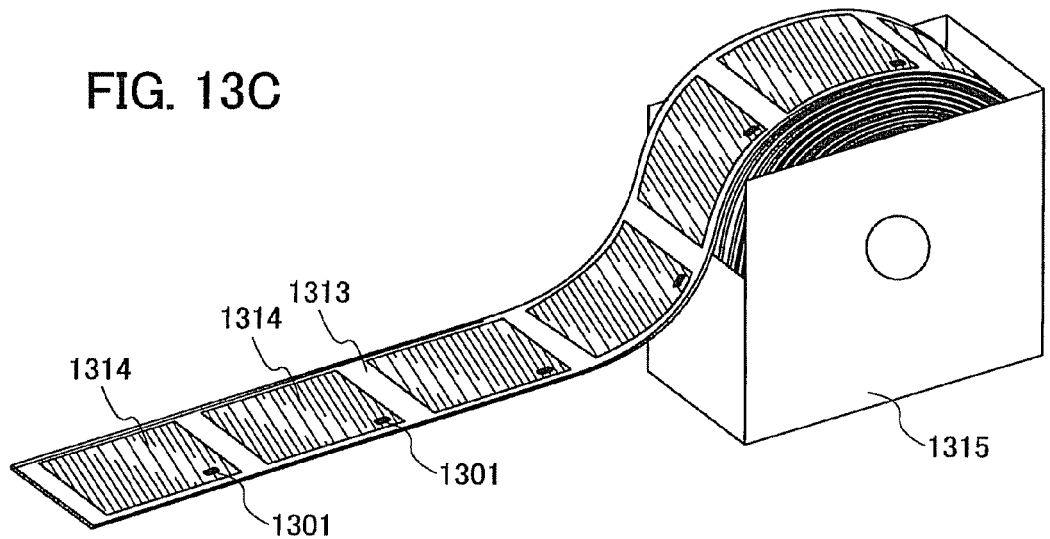
FIG. 13D
FIG. 13E
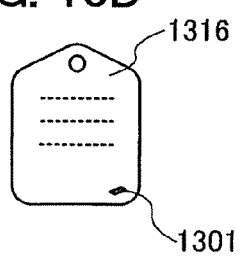
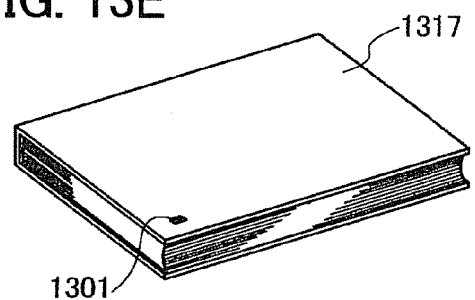

SEMICONDUCTOR DEVICE AND METHOD FOR MANUFACTURING THE SAME

BACKGROUND OF THE INVENTION

1. Field of the Invention

The present invention relates to semiconductor devices and methods for manufacturing the semiconductor devices.

2. Description of the Related Art

In recent years, an individual identification technology in which an ID (individual identification number) is given to an individual object to clarify information such as a history of the object so that it is used for production, management, and the like has attracted attention. In particular, a semiconductor device that can transmit and receive data without contact (also referred to as an RFID (radio frequency identification) tag, an ID tag, an IC tag, an IC chip, an RF (radio frequency) tag, a wireless tag, an electronic tag, or a wireless chip) has been introduced into companies, markets, and the like. It is important to reduce the thickness of the semiconductor device that can transmit and receive data without contact (hereinafter referred to as a semiconductor device) in order to realize reduction in product size, and a technique for reducing the thickness of the semiconductor device has been developed. A thinned semiconductor device is flexible to some extent and thus can be attached to an object that is bent.

For example, Patent Document 1 (Japanese Published Patent Application No. 2005-311342) discloses a method in which a semiconductor element layer including a thin film transistor formed over a heat-resistant substrate is separated from the substrate and transferred to another substrate, for example, a plastic substrate to manufacture a semiconductor device.

SUMMARY OF THE INVENTION

In a semiconductor element layer including a thin film transistor formed by stacking inorganic insulating layers such as a silicon oxide film and a silicon nitride film, the adhesion between the insulating layers is low, and thus, the film is easily peeled off. Peeling of a film in the semiconductor element layer including the thin film transistor causes degradation of reliability of a semiconductor device due to intrusion of moisture or the like.

For example, when a thin film integrated circuit including a TFT and a flexible substrate which are attached to each other by the above method or the like are cut into a plurality of pieces, a cross section between insulating layers is exposed at a cut surface. When insulating layers exposed at the cut surface are formed using an inorganic insulating layer such as a silicon oxide film or a silicon nitride film, in a preservation test under high temperature and high humidity conditions, intrusion of moisture or the like from the exposed surface occurs, and thus, the flexible substrate is peeled from the base insulating layer. Moreover, when the insulating layers exposed at the cut surface are formed using a silicon oxide film, in the preservation test under high temperature and high humidity conditions, intrusion of moisture or the like from the exposed surface of the silicon oxide film is likely to occur, and thus, a thin film integrated circuit is not normally operated.

One embodiment of the present invention is to provide a semiconductor device with reliability improved by reducing the degree of peeling of a film and a method for manufacturing the semiconductor device. Another embodiment of the present invention is to provide a semiconductor device with reliability improved by reducing the degree of peeling of a film in a preservation test under high temperature and high humidity conditions, and a method for manufacturing the semiconductor device.

Features of the present invention in a semiconductor device formed by sequentially stacking a first inorganic insulating layer, a semiconductor element layer including a thin film transistor, a second inorganic insulating layer, an organic insulating layer, and a third inorganic insulating layer over a substrate are as follows. The second inorganic insulating layer is in contact with the first inorganic insulating layer in an opening portion provided in the semiconductor element layer. The third inorganic insulating layer is in contact with the second inorganic insulating layer in an opening portion provided in the organic insulating layer. In a region where the second inorganic insulating layer and the third inorganic insulating layer are in contact with each other, a surface of the second inorganic insulating layer has a plurality of irregularities or a plurality of opening portions.

One embodiment of the present invention is a semiconductor device described as follows. A first inorganic insulating layer, a semiconductor element layer, a second inorganic insulating layer, an organic insulating layer, and a third inorganic insulating layer are sequentially stacked over a substrate. The second inorganic insulating layer is in contact with the first inorganic insulating layer in an opening portion provided in the semiconductor element layer. The third inorganic insulating layer is in contact with the second inorganic insulating layer in an opening portion provided in the organic insulating layer. In a region where the second inorganic insulating layer and the third inorganic insulating layer are in contact with each other, a surface of the second inorganic insulating layer has a plurality of irregularities.

Another embodiment of the present invention is a semiconductor device described as follows. A first inorganic insulating layer, a semiconductor element layer, a second inorganic insulating layer, an organic insulating layer, and a third inorganic insulating layer are sequentially stacked over a substrate. The second inorganic insulating layer is in contact with the first inorganic insulating layer in an opening portion provided in the semiconductor element layer. The third inorganic insulating layer is in contact with the second inorganic insulating layer in an opening portion provided in the organic insulating layer. In a region where the second inorganic insulating layer and the third inorganic insulating layer are in contact with each other, a surface of the second inorganic insulating layer has a plurality of irregularities. In a region where the third inorganic insulating layer overlaps with the plurality of irregularities of the second inorganic insulating layer, a surface of the third inorganic insulating layer has a plurality of irregularities.

Another embodiment of the present invention is a semiconductor device described as follows. A first inorganic insulating layer, a semiconductor element layer, a second inorganic insulating layer, an organic insulating layer, and a third inorganic insulating layer are sequentially stacked over a substrate. The second inorganic insulating layer is in contact with the first inorganic insulating layer in an opening portion provided in the semiconductor element layer. The third inorganic insulating layer is in contact with the second inorganic insulating layer in an opening portion provided in the organic insulating layer. In a region where the second inorganic insulating layer and the third inorganic insulating layer are in contact with each other, a plurality of opening portions are formed in the second inorganic insulating layer. The first inorganic insulating layer and the third inorganic insulating layer are in contact with each other in the plurality of opening portions.

Still another embodiment of the present invention is a semiconductor device described as follows. A first inorganic insulating layer, a semiconductor element layer, a second inorganic insulating layer, an organic insulating layer, and a third inorganic insulating layer are sequentially stacked over a substrate. The second inorganic insulating layer is in contact with the first inorganic insulating layer in an opening portion provided in the semiconductor element layer. The third inorganic insulating layer is in contact with the second inorganic insulating layer in an opening portion provided in the organic insulating layer. In a region where the second inorganic insulating layer and the third inorganic insulating layer are in contact with each other, a plurality of opening portions are formed in the second inorganic insulating layer. The first inorganic insulating layer and the third inorganic insulating layer are in contact with each other in the plurality of opening portions. In a region where the third inorganic insulating layer overlaps with the plurality of opening portions provided in the second inorganic insulating layer, a surface of the third inorganic insulating layer has a plurality of irregularities.

Another embodiment of the present invention is a semiconductor device described as follows. A first inorganic insulating layer, a semiconductor element layer, a second inorganic insulating layer, an organic insulating layer, a conductive layer, and a third inorganic insulating layer are sequentially stacked over a substrate. The second inorganic insulating layer is in contact with the first inorganic insulating layer in an opening portion provided in the semiconductor element layer. The third inorganic insulating layer is in contact with the second inorganic insulating layer in an opening portion provided in the organic insulating layer. The conductive layer is electrically connected to the semiconductor element layer in an opening portion provided in the organic insulating layer and the second inorganic insulating layer. In a region where the second inorganic insulating layer and the third inorganic insulating layer are in contact with each other, a plurality of opening portions are formed in the second inorganic insulating layer.

A further embodiment of the present invention is a semiconductor device described as follows. A first inorganic insulating layer, a semiconductor element layer, a second inorganic insulating layer, an organic insulating layer, a conductive layer, and a third inorganic insulating layer are sequentially stacked over a substrate. The second inorganic insulating layer is in contact with the first inorganic insulating layer in an opening portion provided in the semiconductor element layer. The third inorganic insulating layer is in contact with the second inorganic insulating layer in an opening portion provided in the organic insulating layer. The conductive layer is electrically connected to the semiconductor element layer in an opening portion provided in the organic insulating layer and the second inorganic insulating layer. In a region where the second inorganic insulating layer and the third inorganic insulating layer are in contact with each other, a plurality of opening portions are formed in the second inorganic insulating layer. The first inorganic insulating layer and the third inorganic insulating layer are in contact with each other in the plurality of opening portions.

In addition, one embodiment of the present invention is a method for manufacturing a semiconductor device, including the steps of: forming a separation layer over a substrate; forming a first inorganic insulating layer over the separation layer; forming a semiconductor element layer over the first inorganic insulating layer; forming an opening portion in the semiconductor element layer; forming a second inorganic insulating layer over the semiconductor element layer and a surface of the first inorganic insulating layer, which is exposed by the opening portion provided in the semiconductor element layer; forming an organic insulating layer over the semiconductor element layer with the second inorganic insulating layer interposed therebetween; forming an opening portion in the organic insulating layer; forming a plurality of opening portions in parts of the second inorganic insulating layer, which are exposed by the opening portion provided in the semiconductor element layer and the opening portion provided in the organic insulating layer; and forming a third inorganic insulating layer over the plurality of opening portions and the organic insulating layer.

Another embodiment of the present invention is a method for manufacturing a semiconductor device, including the steps of: forming a separation layer over a substrate; forming a first inorganic insulating layer over the separation layer; forming a semiconductor element layer over the first inorganic insulating layer; forming an opening portion in the semiconductor element layer; forming a second inorganic insulating layer over the semiconductor element layer and a surface of the first inorganic insulating layer, which is exposed by the opening portion provided in the semiconductor element layer; forming an organic insulating layer over the semiconductor element layer with the second inorganic insulating layer interposed therebetween; forming an opening portion in the organic insulating layer; forming a plurality of opening portions in parts of the second inorganic insulating layer, which are exposed by the opening portion provided in the semiconductor element layer and the opening portion provided in the organic insulating layer; forming a conductive layer over the organic insulating layer and the plurality of opening portions provided over the semiconductor element layer; and forming a third inorganic insulating layer over the plurality of opening portions, the conductive layer, and the organic insulating layer.

Still another embodiment of the present invention is a method for manufacturing a semiconductor device, including the steps of: forming a separation layer over a substrate; forming a first inorganic insulating layer over the separation layer; forming a semiconductor element layer over the first inorganic insulating layer; forming an opening portion in the semiconductor element layer; forming a second inorganic insulating layer over the semiconductor element layer and a surface of the first inorganic insulating layer, which is exposed by the opening portion provided in the semiconductor element layer; forming an organic insulating layer over the semiconductor element layer with the second inorganic insulating layer interposed therebetween; forming an opening portion in the organic insulating layer; forming a plurality of opening portions in parts of the second inorganic insulating layer, which are exposed by the opening portion provided in the semiconductor element layer and the opening portion provided in the organic insulating layer; forming a first sealing layer including a fibrous body and an organic resin layer, over the third inorganic insulating layer; physically separating the substrate and the separation layer; forming a second sealing layer on a surface of the first inorganic insulating layer, which is exposed by separating the separation layer; and cutting a region where the plurality of opening portions formed in the second inorganic insulating layer are provided.

A further embodiment of the present invention is a method for manufacturing a semiconductor device, including the steps of: forming a separation layer over a substrate; forming a first inorganic insulating layer over the separation layer; forming a semiconductor element layer over the first inorganic insulating layer; forming an opening portion in the semiconductor element layer; forming a second inorganic insulating layer over the semiconductor element layer and a surface of the first inorganic insulating layer, which is exposed by the opening portion provided in the semiconductor element layer; forming an organic insulating layer over the semiconductor element layer with the second inorganic insulating layer interposed therebetween; forming an opening portion in the organic insulating layer; forming a plurality of opening portions in parts of the second inorganic insulating layer, which are exposed by the opening portion provided in the semiconductor element layer and the opening portion provided in the organic insulating layer; forming a conductive layer over the organic insulating layer and the plurality of opening portions provided over the semiconductor element layer; forming a third inorganic insulating layer over the plurality of opening portions, the conductive layer, and the organic insulating layer; forming a first sealing layer including a fibrous body and an organic resin layer, over the third inorganic insulating layer; physically separating the substrate and the separation layer; forming a second sealing layer on a surface of the first inorganic insulating layer, which is exposed by separating the separation layer; and cutting a region where the plurality of opening portions formed in the second inorganic insulating layer are provided.

In the semiconductor device formed according to one embodiment of the present invention, the adhesion between the second inorganic insulating layer and the third inorganic insulating layer can be particularly increased, and the degree of peeling of a film from an edge portion can be reduced especially in the preservation test under high temperature and high humidity conditions. Accordingly, intrusion of moisture into the semiconductor element layer from an interface between the second inorganic insulating layer and the third inorganic insulating layer can be suppressed. That is, heat resistance and moisture resistance can be improved, and a semiconductor device with improved reliability and a method for manufacturing the semiconductor device can be provided.

BRIEF DESCRIPTION OF THE DRAWINGS

In the accompanying drawings:

FIGS. 7A to 7F are cross-sectional views illustrating semiconductor devices;

FIGS. 13A to 13E illustrate semiconductor devices;

DETAILED DESCRIPTION OF THE INVENTION

Figure 1A:
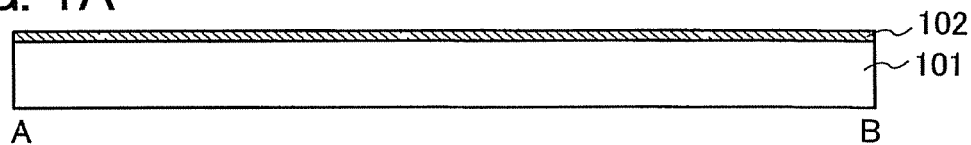
FIGS. 1A to 1E are cross-sectional views illustrating semiconductor devices.

Hereinafter, embodiments of the present invention will be described with reference to the accompanying drawings. Note that the present invention can be implemented in various modes, and it is easily understood by those skilled in the art that modes and details can be variously changed without departing from the spirit and scope of the present invention. Therefore, the present invention is not construed as being limited to what is described in the embodiments. Note that in the drawings, the same portions or portions having similar functions are denoted by the same reference numerals, and the description will not be repeated.

(Embodiment 1)

This embodiment will be described with reference to FIGS. 1A to 1E, FIG. 2, FIGS. 3A and 3B, FIGS. 4A and 4B, and FIGS. 14A to 14F. Note that FIGS. 14A to 14E are top views corresponding to the cross-sectional views of FIGS. 1A to 1E.

Figure 14A:
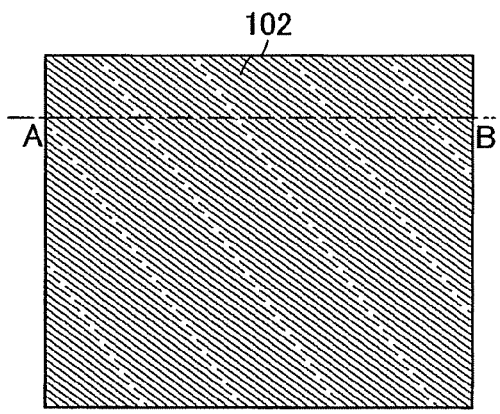
FIGS. 14A to 14F are top views illustrating the semiconductor devices.

First, a first inorganic insulating layer 102 is formed over a substrate 101 (see FIG. 1A and FIG. 14A).

As the substrate 101, a glass substrate, a quartz substrate, a ceramic substrate, a metal substrate in which an insulating layer is formed on at least one surface, an organic resin substrate, or the like can be used. As an example, a glass substrate is used as the substrate 101.

The first inorganic insulating layer 102 is formed using a single layer or a stack of an inorganic compound by a sputtering method, a plasma CVD method, a coating method, a printing method, or the like. The inorganic compound used for the first inorganic insulating layer 102 having a single-layer structure is silicon nitride (SiNx) or silicon nitride oxide (SiNxOy) (x>y). Alternatively, the first inorganic insulating layer 102 may have a stacked structure. The inorganic compounds used for the first inorganic insulating layer having a stacked structure are silicon oxide (SiOx), silicon nitride (SiNx), silicon oxynitride (SiOxNy) (x>y), and/or silicon nitride oxide (SiNxOy) (x>y). When the first inorganic insulating layer 102 has a two-layer structure, it is preferable that, for example, a silicon oxynitride film be a first layer (a layer that is in contact with the substrate 101) and a silicon nitride film be a second layer. When the insulating layer serving as a base has a three-layer structure, it is preferable that a first insulating film (a layer that is in contact with the substrate 101) be a silicon oxide film, a second insulating film be a silicon oxynitride film, and a third insulating film be a silicon nitride film. The first inorganic insulating layer 102 which includes a layer containing silicon nitride or silicon nitride oxide functions as a blocking film for preventing impurities and moisture from entering a semiconductor element layer 103 to be formed over the first inorganic insulating layer 102.

Note that silicon oxynitride contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. In addition, silicon nitride oxide contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 25 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Note that terms such as first, second, third to N-th (N is a natural number) used in this specification are given in order to avoid confusion between components and do not limit the number of components.

Figure 1B:
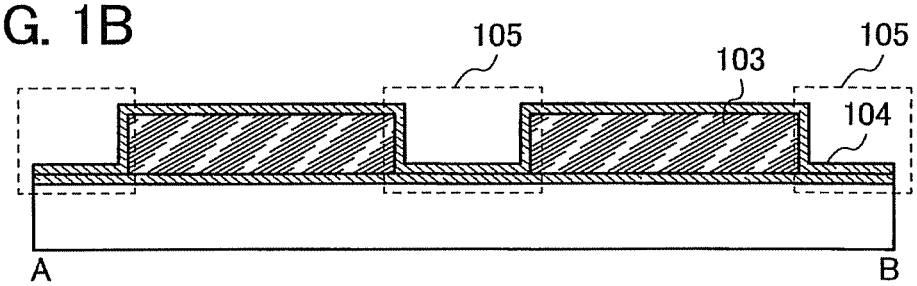
Figure 14B:
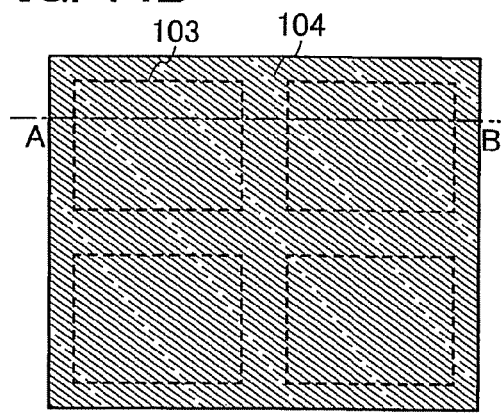
Figure 14C:
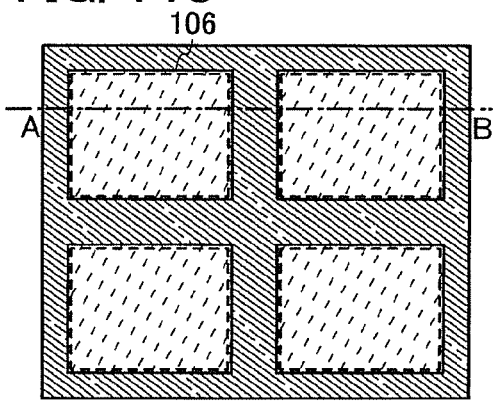

Next, the semiconductor element layer 103 is formed over the first inorganic insulating layer 102, and a second inorganic insulating layer 104 is formed so as to cover the semiconductor element layer 103 (see FIG. 1B and FIG. 14B). Although not shown, description in this embodiment is made on the assumption that the semiconductor element layers 103 are provided over the first inorganic insulating layer 102 in accordance with the respective regions functioning as a semiconductor device and then cut to obtain a plurality of semiconductor devices. Note that even when one semiconductor element layer 103 is formed over the first inorganic insulating layer, the structure shown in this embodiment can reduce the degree of peeling of a film at an edge portion particularly in a preservation test under high temperature and high humidity conditions, and can improve reliability.

Figure 2:
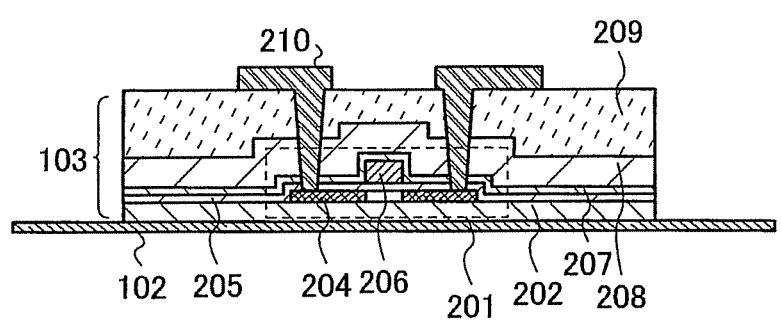
FIG. 2 is a cross-sectional view illustrating a semiconductor device.

As an example of the semiconductor element layer 103, FIG. 2 illustrates the semiconductor element layer 103 including a thin film transistor 201 over the first inorganic insulating layer 102. Note that although not shown in FIG. 2, the semiconductor element layer 103 over the first inorganic insulating layer 102 includes a plurality of thin film transistors.

The thin film transistor 201 formed over a base film 202 includes a semiconductor layer 204 having a source region, a drain region, and a channel formation region; a gate insulating layer 205; and a gate electrode 206.

Note that the base film 202 and a film in the first semiconductor element layer 102, which is on the side not in contact with the glass substrate, function as a blocking film for preventing impurities from entering the semiconductor layer 204 in the semiconductor element layer and as a film for increasing the adhesion between the first inorganic insulating layer 102 and the semiconductor layer 204. As the base film 202, a single layer or a stack of a silicon oxide film, a silicon nitride oxide film, a silicon nitride film, or a silicon oxynitride film can be used. Note that the base film 202 can be omitted when the first inorganic insulating layer can also function as the base film 202. Further, the gate electrode 206 provided over the semiconductor layer 204 with the gate insulating layer interposed therebetween may be formed using a single layer or a stack of a conductive film such as a metal film. In this embodiment, the gate electrode 206 can be formed using a stack of a tantalum nitride film and a tungsten film, for example.

An interlayer insulating film 207, an interlayer insulating film 208, and an interlayer insulating film 209 are formed to cover the thin film transistor 201. Moreover, wirings 210 that are in contact with the source region and the drain region in the semiconductor layer 204 are formed over the interlayer insulating film 209. Note that as the gate insulating layer 205 and the interlayer insulating films 207, 208, and 209, any of a silicon oxide film, a silicon nitride oxide film, a silicon nitride film, or a silicon oxynitride film may be used. In this embodiment, a silicon oxynitride film is formed as the gate insulating layer 205 and the interlayer insulating films 207 and 209, and a silicon nitride oxide film is formed as the interlayer insulating film 208. Further, the wirings 210 formed over the interlayer insulating film 209 may be formed using a single layer or a stack of a conductive film such as a metal film. In this embodiment, the wirings 210 are formed using a stack of three layers of a titanium film, an aluminum film, and a titanium film, for example.

Note that the semiconductor element layer 103 refers to not only a layer including a thin film transistor as illustrated in FIG. 2, but also a layer including a plurality of elements formed using semiconductor characteristics. For example, the semiconductor element layer 103 may include a plurality of elements such as a diode, a resistor, a capacitor, or a memory element in addition to a thin film transistor.

Referring back to FIG. 1B, in the semiconductor element layer 103 in which the formation of the wirings 210 illustrated in FIG. 2 is completed, the base film 202, the gate insulating layer 205, and the interlayer insulating films 207, 208, and 209 are etched, so that opening portions 105 are formed between the semiconductor element layers 103 as illustrated in FIG. 1B. The second inorganic insulating layer 104 formed so as to cover the semiconductor element layer 103 is provided to be in contact with the first inorganic insulating layer 102 in the opening portion 105. In this embodiment, the semiconductor element layer 103 can be surrounded by the first inorganic insulating layer 102 and the second inorganic insulating layer 104 each containing silicon nitride or silicon nitride oxide, whereby intrusion of impurities and moisture can further be suppressed, and a semiconductor device with higher reliability can be obtained.

The second inorganic insulating layer 104 is formed using a single layer or a stack of an inorganic compound by a sputtering method, a plasma CVD method, a coating method, a printing method, or the like. The inorganic compound used for the second inorganic insulating layer 104 having a single-layer structure is silicon nitride (SiNx) or silicon nitride oxide (SiNxOy) (x>y). Alternatively, the second inorganic insulating layer 104 may have a stacked structure. The inorganic compounds used for the second inorganic insulating layer 104 having a stacked structure are silicon oxide (SiOx), silicon nitride (SiNx), silicon oxynitride (SiOxNy) (x>y), and/or silicon nitride oxide (SiNxOy) (x>y). The second inorganic insulating layer 104 which contains silicon nitride or silicon nitride oxide functions as a blocking film for preventing impurities and moisture from entering the semiconductor element layer 103 formed below the second inorganic insulating layer 104.

Figure 1C:
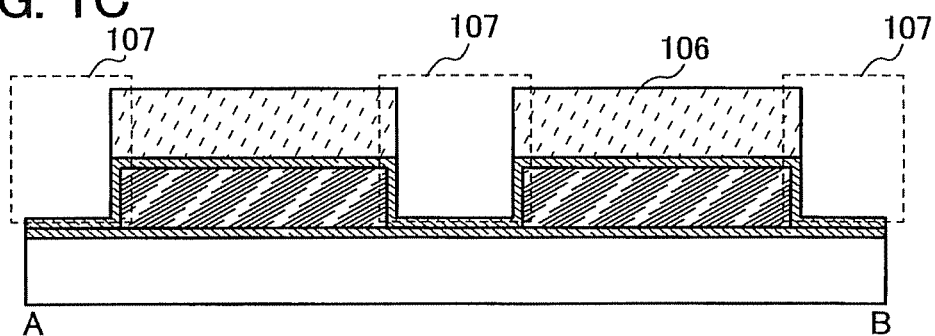
Figure 3A:
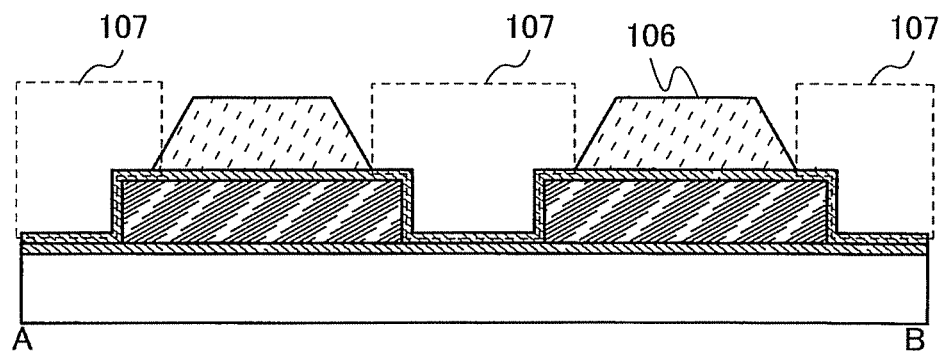
FIGS. 3A and 3B are cross-sectional views illustrating semiconductor devices.
Figure 3B:
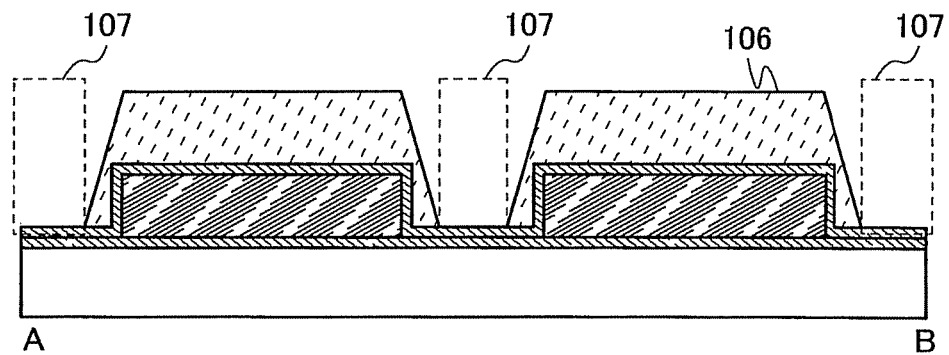

Next, an organic insulating layer 106 is formed over the second inorganic insulating layer 104. Then, etching is performed so that the organic insulating layer 106 remains over the semiconductor element layer 103 with the second inorganic insulating layer 104 interposed therebetween, whereby opening portions 107 are formed (see FIG. 1C and FIG. 14C). Note that FIG. 1C illustrates the structure in which the organic insulating layer 106 is provided over the semiconductor element layer 103 and over the second inorganic insulating layer 104 except in a region where the first inorganic insulating layer 102 and the second inorganic insulating layer 104 are in direct contact with each other. However, there is no particular limitation on the structure, and another structure may be employed. For example, as illustrated in FIG. 3A, the area of the opening portion 107 in the organic insulating layer 106 may be larger than that of the region where the first inorganic insulating layer 102 and the second inorganic insulating layer 104 are in direct contact with each other. Alternatively, as illustrated in FIG. 3B, the area of the opening portion 107 in the organic insulating layer 106 may be smaller than that of the region where the first inorganic insulating layer 102 and the second inorganic insulating layer 104 are in direct contact with each other. Note that as illustrated in FIGS. 3A and 3B, the cross-sectional shape of edge portions of the organic insulating layer is preferably tapered when the organic insulating layer is processed by etching. The tapered shape of the edge portions can prevent disconnection of the wiring due to the step shape. In the structure shown in this embodiment, the semiconductor element layer 103 is surrounded by the first inorganic insulating layer 102 and the second inorganic insulating layer 104 which contain silicon nitride or silicon nitride oxide, whereby intrusion of impurities or moisture from the organic insulating layer into the semiconductor element layer 103 can be prevented even in the structures illustrated in FIGS. 3A and 3B. Note that in this embodiment, description is made on the assumption that the opening portion 107 is formed while the organic insulating layer 106 remains over the semiconductor element layer 103 with the second inorganic insulating layer 104 interposed therebetween.

Figure 1D:
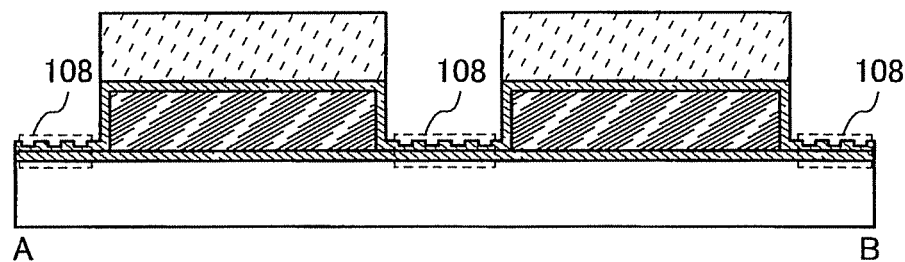
Figure 4A:
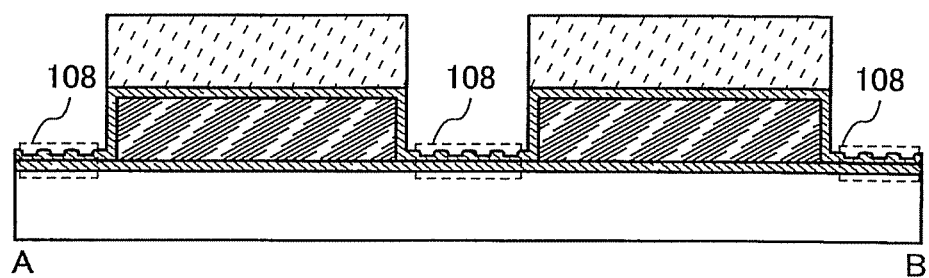
FIGS. 4A and 4B are cross-sectional views illustrating semiconductor devices.
Figure 4B:
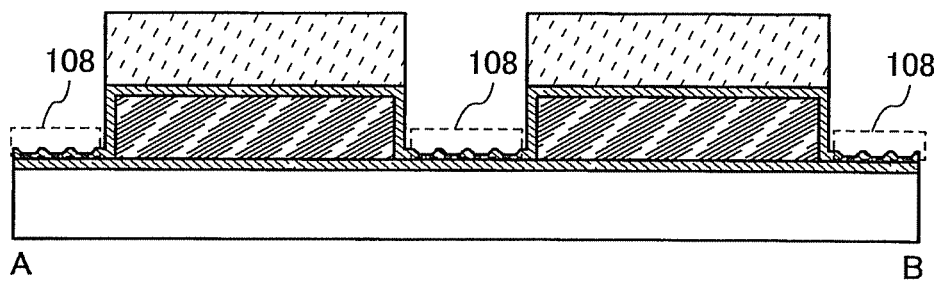
Figure 14D:
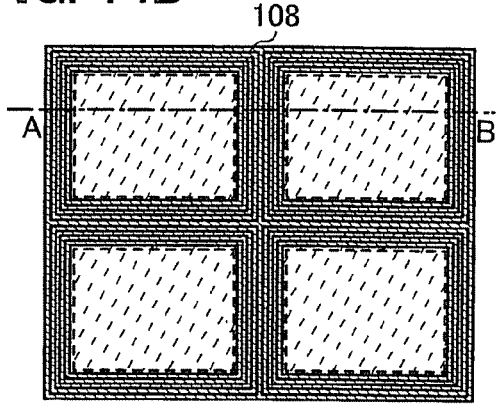

Then, in the region where the first inorganic insulating layer 102 and the second inorganic insulating layer 104 are in direct contact with each other, a surface of the second inorganic insulating layer 104 is processed to have a plurality of irregularities 108 (see FIG. 1D and FIG. 14D). The plurality of irregularities 108 may be formed through steps such as resist application using a photosensitive resin called a photoresist, pattern exposure, development, selective etching by anisotropic etching using the resist as a mask, and resist removal by using a lithography technique. Note that as illustrated in FIG. 1D, a surface of the plurality of irregularities 108 may have a cross-sectional shape such that upper portions of the projections are columnar. Alternatively, the upper portions of the plurality of irregularities 108 may be rounded as illustrated in FIG. 4A, or may be substantially pointed as illustrated in FIG. 4B. Note that in the top view of FIG. 14D, a region where the plurality of irregularities 108 are provided is rectangular corresponding to the shape of the region where the semiconductor element layer 103 is provided; however, the shape of the region is not particularly limited thereto. For example, with a structure illustrated in FIG. 14F, in which the region occupied by the semiconductor element layer 103 has a shape with chamfered corners and the plurality of irregularities 108 are provided so as to surround the region, the degree of peeling of a film can be reduced especially in the preservation test under high temperature and high humidity conditions.

Figure 1E:
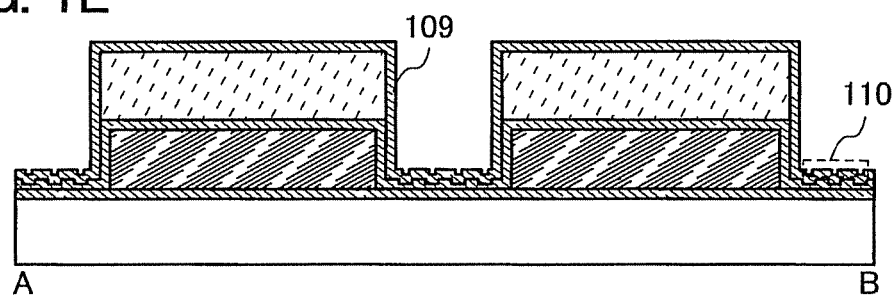
Figure 14E:
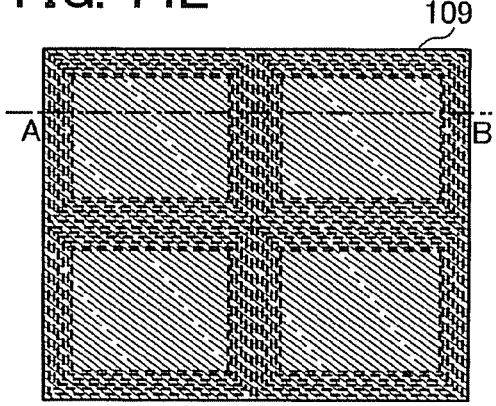
Figure 14F:
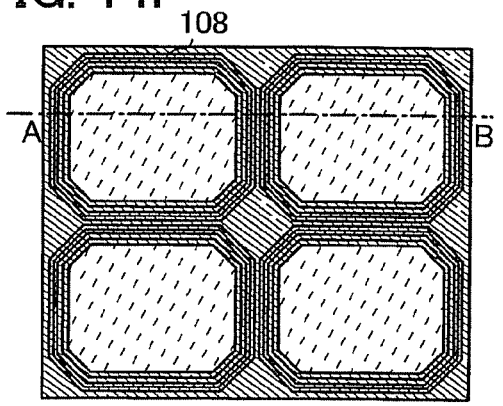

Next, a third inorganic insulating layer 109 is formed to cover the organic insulating layer 106 and the second inorganic insulating layer 104 provided with the plurality of irregularities 108 (see FIG. 1E and FIG. 14E). The third inorganic insulating layer 109 can suppress intrusion of moisture and impurities into the semiconductor element layer. Further, when the second inorganic insulating layer 104 has the plurality of irregularities 108, the area where the second inorganic insulating layer 104 and the third inorganic insulating layer 109 are in direct contact with each other can be increased. Accordingly, the adhesion between the second inorganic insulating layer 104 and the third inorganic insulating layer 109 can be increased.

The third inorganic insulating layer 109 is formed using a single layer or a stack of an inorganic compound by a sputtering method, a plasma CVD method, a coating method, a printing method, or the like. The inorganic compound used for the third inorganic insulating layer 109 having a single-layer structure is silicon nitride ($SiN_x$) or silicon nitride oxide ($SiN_xO_y$) ($x>y$). Alternatively, the third inorganic insulating layer 109 may have a stacked structure. The inorganic compounds used for the third inorganic insulating layer 109 having a stacked structure are silicon oxide ($SiO_x$), silicon nitride ($SiN_x$), silicon oxynitride ($SiO_xN_y$) ($x>y$), and/or silicon nitride oxide ($SiN_xO_y$) ($x>y$). The third inorganic insulating layer 109 which contains silicon nitride or silicon nitride oxide functions as a blocking film for preventing impurities and moisture from entering the semiconductor element layer 103 surrounded by the first inorganic insulating layer 102 and the second inorganic insulating layer 104.

Moreover, in a region where the third inorganic insulating layer 109 overlaps with the plurality of irregularities 108 of the second inorganic insulating layer 104, a surface of the third inorganic insulating layer 109 has a plurality of irregularities 110. Note that as illustrated in FIG. 1E, the size or depth of the recessed portion in a cross section of the plurality of irregularities 110 of the surface of the third inorganic insulating layer 109 varies depending on the size or depth of the recessed portion of the plurality of irregularities 108 of the second inorganic insulating layer 104 or the thickness or step coverage of the third inorganic insulating layer 109. The surface of the third inorganic insulating layer 109 has the plurality of irregularities 110, whereby the adhesion between the surface of the third inorganic insulating layer 109 and a film to be formed on the third inorganic insulating layer 109 can be increased.

In this embodiment, the adhesion between the second inorganic insulating layer 104 and the third inorganic insulating layer 109, and between the surface of the third inorganic insulating layer 109 and the film to be formed on the third inorganic insulating layer 109 can be increased. Accordingly, the degree of peeling of a film at an edge portion can be reduced particularly in the preservation test under high temperature and high humidity conditions. That is, a semiconductor device with improved water resistance and reliability can be provided.

As has been described above, in the semiconductor device shown in this embodiment, the adhesion between the second inorganic insulating layer 104 and the third inorganic insulating layer 109, and between the surface of the third inorganic insulating layer 109 and the film to be formed on the third inorganic insulating layer 109 can be increased; thus, the degree of peeling of a film at an edge portion can be reduced particularly in the preservation test under high temperature and high humidity conditions. Accordingly, intrusion of moisture into the semiconductor element layer from an interface between the second inorganic insulating layer and the third inorganic insulating layer can be suppressed. That is, heat resistance and moisture resistance can be improved, and a semiconductor device with improved reliability and a method for manufacturing the semiconductor device can be provided.

Note that in this embodiment, what is illustrated in the drawing can be freely combined with or replaced with what is described in other embodiments as appropriate.

(Embodiment 2)

In this embodiment, an example of a semiconductor device which is different from that shown in Embodiment 1 will be described with reference to FIGS. 5A to 5C and FIGS. 6A and 6B.

Figure 5A:
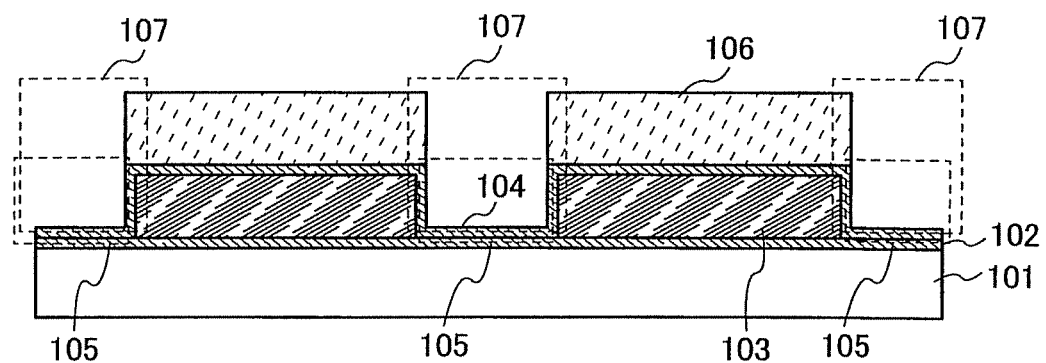
FIGS. 5A to 5C are cross-sectional views illustrating semiconductor devices.

As described in Embodiment 1, first, the first inorganic insulating layer 102 is formed over the substrate 101. Then, the semiconductor element layer 103 is formed over the first inorganic insulating layer 102, and the opening portion 105 is formed between the semiconductor element layers 103. Next, the second inorganic insulating layer 104 is formed so as to cover the semiconductor element layers 103. Then, the organic insulating layer 106 is formed over the second inorganic insulating layer 104, and etching is performed so that the organic insulating layer 106 remains over the semiconductor element layer 103 with the second inorganic insulating layer 104 interposed therebetween, whereby the opening portions 107 are formed (FIG. 5A).

Note that description of the substrate 101, the first inorganic insulating layer 102, the semiconductor element layer 103, the opening portion 105, the second inorganic insulating layer 104, the organic insulating layer 106, and the opening portion 107 is similar to the description of FIGS. 1A to 1C in Embodiment 1; therefore, detailed description is not repeated here.

Figure 5B:
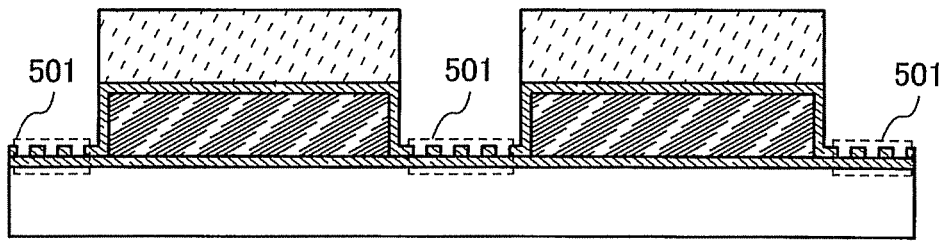
Figure 6A:
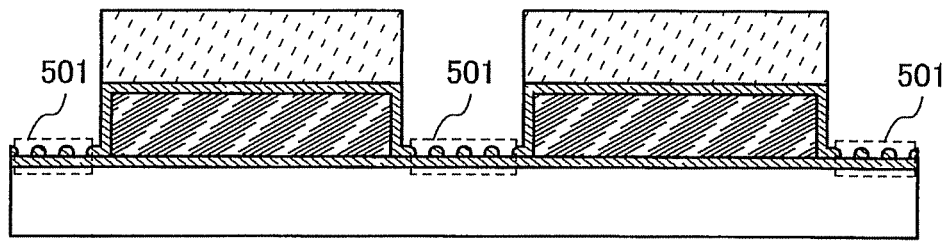
FIGS. 6A and 6B are cross-sectional views illustrating semiconductor devices.
Figure 6B:
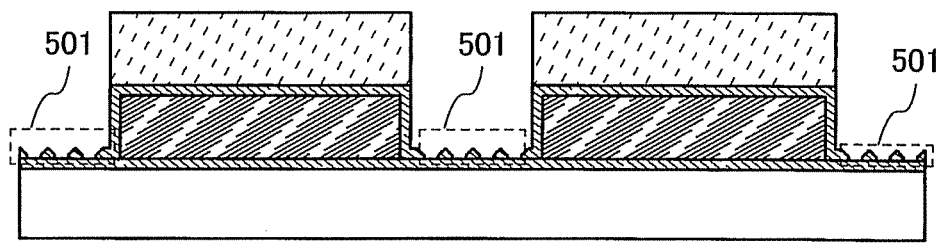

Next, a plurality of opening portions 501 are formed in the second inorganic insulating layer 104 in a region where the first inorganic insulating layer 102 and the second inorganic insulating layer 104 are in direct contact with each other (FIG. 5B). The plurality of opening portions 501 may be formed through steps such as resist application using a photosensitive resin called a photoresist, pattern exposure, development, selective etching by anisotropic etching using the resist as a mask, and resist removal by using a lithography technique. Note that as illustrated in FIG. 5B, the cross-sectional shape of the surface of the plurality of opening portions 501 may be columnar. Alternatively, the cross-sectional shape of the plurality of opening portions 501 may be rounded as illustrated in FIG. 6A, or may be substantially pointed as illustrated in FIG. 6B.

Figure 5C:
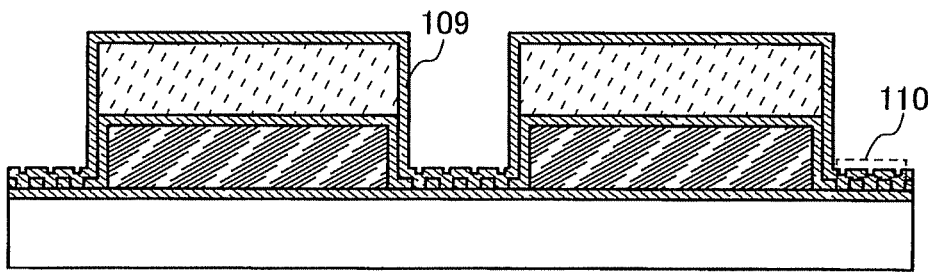

Then, the third inorganic insulating layer 109 is formed to cover the organic insulating layer 106 and the second inorganic insulating layer 104 provided with the plurality of opening portions 501 (FIG. 5C). As in Embodiment 1, the third inorganic insulating layer 109 can prevent diffusion of moisture and impurities from the organic insulating layer 106. Further, the plurality of opening portions 501 are formed in the second inorganic insulating layer 104, whereby the area where the second inorganic insulating layer 104 and the third inorganic insulating layer 109 are in direct contact with each other can be increased. Accordingly, the adhesion between the second inorganic insulating layer 104 and the third inorganic insulating layer 109 can be increased.

In this embodiment, by forming the plurality of opening portions 501 in the second inorganic insulating layer 104, a region where the first inorganic insulating layer 102 and the third inorganic insulating layer 109 are in direct contact with each other can be formed. Accordingly, the adhesion between the first insulating layer 102 and the third inorganic insulating layer 109 can be increased.

Note that description of the third inorganic insulating layer 109 is similar to the description of FIG. 1E in Embodiment 1; therefore, detailed description is not repeated here.

Moreover, in a region where the third inorganic insulating layer 109 overlaps with the plurality of opening portions 501 in the second inorganic insulating layer 104, a surface of the third inorganic insulating layer 109 has the plurality of irregularities 110. Note that as illustrated in FIG. 5C, the size or depth of the opening in a cross section of the plurality of irregularities 110 of the surface of the third inorganic insulating layer 109 varies depending on the size or depth of the opening in the plurality of opening portions 501 in the second inorganic insulating layer 104 or the thickness or step coverage of the third inorganic insulating layer 109. The surface of the third inorganic insulating layer 109 has the plurality of irregularities 110, whereby the adhesion between the surface of the third inorganic insulating layer 109 and the film to be formed on the third inorganic insulating layer 109 can be increased.

In this embodiment, the adhesion between the second inorganic insulating layer 104 and the third inorganic insulating layer 109, between the first inorganic insulating layer 102 and the third inorganic insulating layer 109, and between the surface of the third inorganic insulating layer 109 and the film to be formed on the third inorganic insulating layer 109 can be increased. Accordingly, the degree of peeling of a film at an edge portion can be reduced particularly in the preservation test under high temperature and high humidity conditions. That is, a semiconductor device with improved water resistance and reliability can be provided.

As has been described above, in the semiconductor device shown in this embodiment, the adhesion between the second inorganic insulating layer 104 and the third inorganic insulating layer 109, between the first inorganic insulating layer 102 and the third inorganic insulating layer 109, and between the surface of the third inorganic insulating layer 109 and the film to be formed on the third inorganic insulating layer 109 can be increased. Thus, the degree of peeling of a film at an edge portion can be reduced particularly in the preservation test under high temperature and high humidity conditions. Accordingly, moisture can be prevented from entering the semiconductor element layer from interfaces between the first inorganic insulating layer 102 and the third inorganic insulating layer 109, between the second inorganic insulating layer 104 and the third inorganic insulating layer 109, and between the surface of the third inorganic insulating layer 109 and the film to be formed on the third inorganic insulating layer 109. That is, a semiconductor device with improved water resistance and reliability and a method for manufacturing the semiconductor device can be provided.

Note that in this embodiment, what is illustrated in the drawing can be freely combined with or replaced with what is described in other embodiments as appropriate.

(Embodiment 3)

In this embodiment, the semiconductor device described in Embodiment 2 and a method for manufacturing the semiconductor device will be specifically described.

This embodiment will be described with reference to FIGS. 7A to 7F and FIGS. 15A to 15F. Note that FIGS. 15A to 15F are top views corresponding to the cross-sectional views of FIGS. 7A to 7F.

Figure 15A:
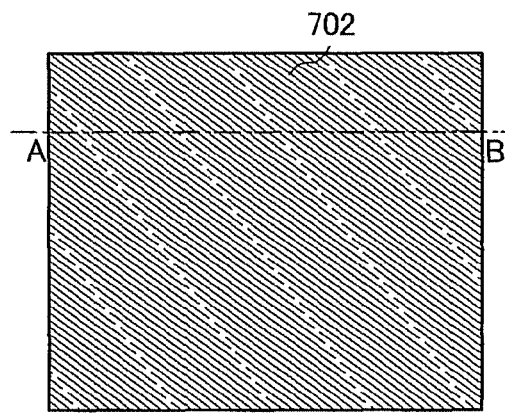
FIGS. 15A to 15F are top views illustrating the semiconductor devices.
Figure 15B:
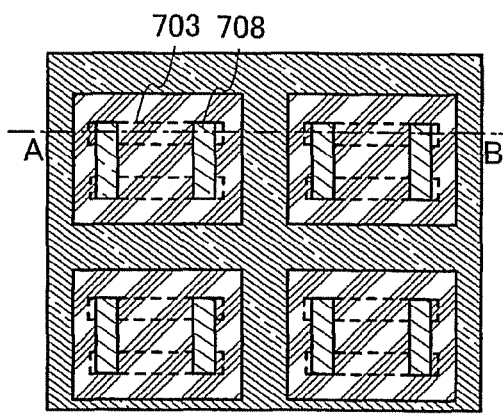
Figure 15C:
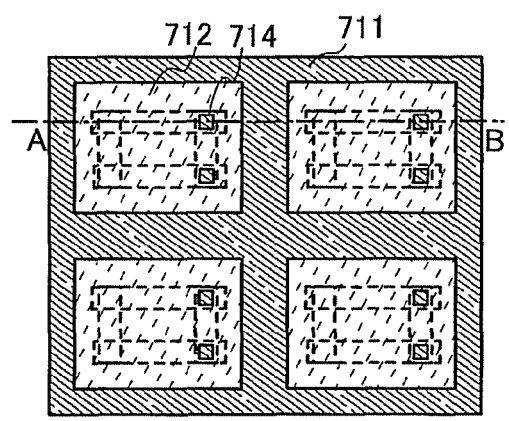

First, a first inorganic insulating layer 702 is formed over a substrate 701 (see FIG. 7A and FIG. 15A).

Note that description of the substrate 701 and the first inorganic insulating layer 702 is similar to the description of the substrate 101 and the first inorganic insulating layer 102 illustrated with reference to FIG. 1A in Embodiment 1; therefore, detailed description is not repeated here.

Next, a thin film transistor 703 is formed over the first inorganic insulating layer 702. Note that the thin film transistor 703 is not necessarily formed on the first inorganic insulating layer 702. Alternatively, a base film (not shown) may be formed and a thin film transistor may be formed over the base film.

The thin film transistor 703 formed over the first inorganic insulating layer 702 includes a semiconductor layer 704 having a source region, a drain region, and a channel formation region; a gate insulating layer 705; and a gate electrode 706. Then, an interlayer insulating film 707 is formed to cover the thin film transistor 703. Moreover, wirings 708 that are in contact with the source region and the drain region in the semiconductor layer 704 are formed over the interlayer insulating film 707. After the wirings 708 are formed, etching is performed so that the gate insulating layer 705 and the interlayer insulating film 707 are divided into semiconductor devices, whereby opening portions 709 are formed between the thin film transistors 703 (see FIG. 7B and FIG. 15B).

Note that description of the gate insulating layer 705, the gate electrode 706, the interlayer insulating film 707, and the wiring 708 is similar to the description of the gate insulating layer 205, the gate electrode 206, the interlayer insulating films 207 to 209, and the wiring 210 illustrated with reference to FIG. 2 in Embodiment 1; therefore, detailed description is not repeated here.

Note that as in the description of FIG. 2 in Embodiment 1, the semiconductor device shown in this embodiment does not necessarily have a structure including a thin film transistor and may include a plurality of elements formed using semiconductor characteristics. For example, the semiconductor device may include a diode, a resistor, a capacitor, a memory element, or the like in addition to a thin film transistor.

Next, a second inorganic insulating layer 711 is formed so as to cover the interlayer insulating film 707, the wiring 708, and the opening portions 709. Then, an organic insulating layer 712 is formed over the second inorganic insulating layer 711, and etching is performed so that the organic insulating layer 712 remains over the thin film transistor 703 with the second inorganic insulating layer 711 interposed therebetween, whereby opening portions 713 are formed. Moreover, an opening 714 for realizing electrical connection with the wiring 708 of the thin film transistor 703 in a later step is formed in the organic insulating layer 712 (see FIG. 7C and FIG. 15C). In this embodiment, the thin film transistor 703 can be surrounded by the first inorganic insulating layer 702 and the second inorganic insulating layer 711 as in Embodiment 1, whereby intrusion of impurities and moisture into the semiconductor layer 704 can further be suppressed, and a semiconductor device with higher reliability can be obtained.

Note that description of the second inorganic insulating layer 711 and the organic insulating layer 712 is similar to the description of the second inorganic insulating layer 104 and the organic insulating layer 106 illustrated in FIG. 5A in Embodiment 2; therefore, detailed description is not repeated here.

Figure 15D:
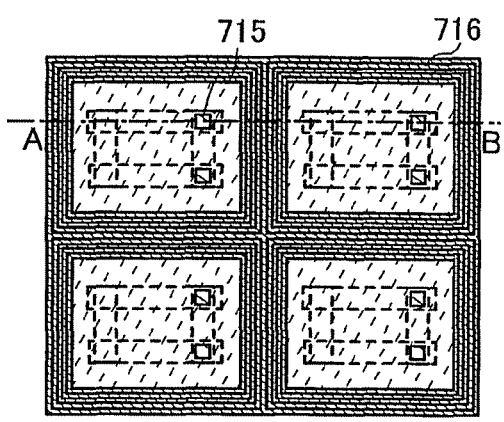

Next, etching treatment for forming an opening 715 that reaches the wiring 708 is performed on the opening 714 for realizing electrical connection with the wiring 708 of the thin film transistor 703 in a later step, and at the same time, a plurality of opening portions 716 are formed in the second inorganic insulating layer 711 in the opening portion 713 where the first inorganic insulating layer 702 and the second inorganic insulating layer 711 are in direct contact with each other (see FIG. 7D and FIG. 15D). The plurality of opening portions 716 may be formed through steps such as resist application using a photosensitive resin called a photoresist, pattern exposure, development, selective etching by anisotropic etching using the resist as a mask, and resist removal by using a lithography technique. Note that as has been described with reference to FIGS. 6A and 6B in Embodiment 2, there is no particular limitation on the shape of the surface of the plurality of opening portions 716.

In the structure in this embodiment, the plurality of opening portions 716 can be formed in the second inorganic insulating layer 711 at the same time as the etching treatment for forming the opening 715 that reaches the wiring 708. Accordingly, it is not necessary to use an additional photomask for providing a plurality of opening portions in the second inorganic insulating layer by lithography. Thus, the number of photomasks for forming a semiconductor device can be reduced.

Figure 15E:
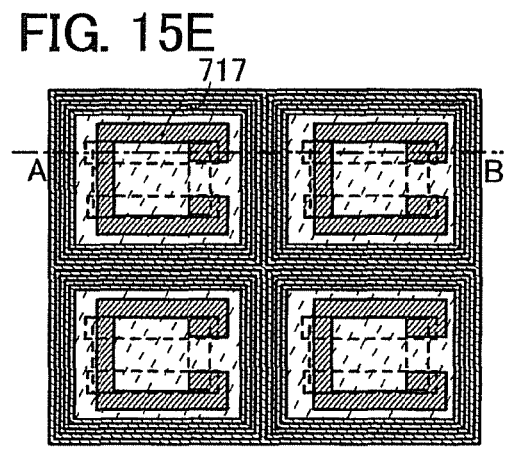
Figure 15F:
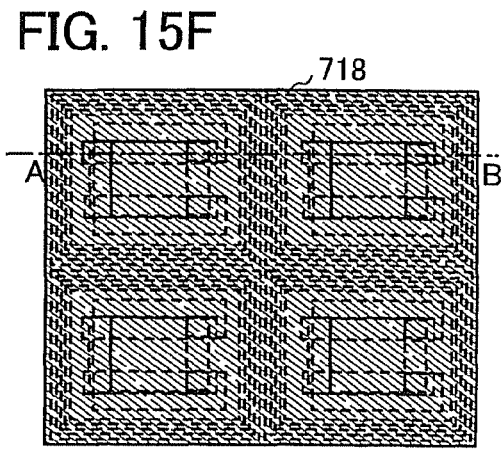

Then, a conductive layer 717 that is electrically connected to the wiring 708 is formed over the openings 714 and 715 and the organic insulating layer 712 (see FIG. 7E and FIG. 15E). In this embodiment, the conductive layer 717 is formed using a stack of a titanium film and an aluminum film. For example, the conductive layer 717 functions as an antenna for receiving a wireless signal from the outside.

Next, a third inorganic insulating layer 718 is formed to cover the second inorganic insulating layer 711, the organic insulating layer 712, and the conductive layer 717. Then, as has been described in Embodiment 2, in a region where the inorganic insulating layer 718 overlaps with the plurality of opening portions 716 provided in the second inorganic insulating layer 711, a surface of the third inorganic insulating layer 718 is formed to have a plurality of irregularities 719 (see FIG. 7F and FIG. 15F). The surface of the third inorganic insulating layer 718 has the plurality of irregularities 719, whereby the adhesion between the surface of the third inorganic insulating layer 718 and a film to be formed on the third inorganic insulating layer 718 can be increased particularly in the preservation test under high temperature and high humidity conditions.

As in Embodiment 1, the third inorganic insulating layer 718 functions as a blocking film for preventing impurities and moisture from entering the conductive layer 717 and the thin film transistor 703 surrounded by the first inorganic insulating layer 702 and the second inorganic insulating layer 711.

As has been described above, in the semiconductor device shown in this embodiment, the adhesion between the second inorganic insulating layer 711 and the third inorganic insulating layer 718, between the first inorganic insulating layer 702 and the third inorganic insulating layer 718, and between the surface of the third inorganic insulating layer 718 and the film to be formed on the third inorganic insulating layer 718 can be increased. Thus, the degree of peeling of a film at an edge portion can be reduced particularly in the preservation test under high temperature and high humidity conditions. Accordingly, moisture can be prevented from entering the thin film transistor 703 from interfaces between the first inorganic insulating layer 702 and the third inorganic insulating layer 718, between the second inorganic insulating layer 711 and the third inorganic insulating layer 718, and between the surface of the third inorganic insulating layer 718 and the film to be formed on the third inorganic insulating layer 718. That is, heat resistance and moisture resistance can be improved, and a semiconductor device with improved reliability and a method for manufacturing the semiconductor device can be provided.

In addition, in the structure in this embodiment, the plurality of opening portions 716 can be formed in the second inorganic insulating layer 711 at the same time as the etching treatment for forming the opening 715 that reaches the wiring 708. Accordingly, it is not necessary to use an additional photomask for providing a plurality of opening portions in the second inorganic insulating layer by lithography, whereby a method for manufacturing the semiconductor device in which the number of photomasks can be reduced can be provided.

Note that in this embodiment, what is illustrated in the drawing can be freely combined with or replaced with what is described in other embodiments as appropriate.

(Embodiment 4)

In this embodiment, a method for manufacturing the semiconductor device, which is different from that described in Embodiment 3, will be described.

This embodiment will be described with reference to FIGS. 8A to 8D, FIGS. 9A to 9C, FIG. 10, and FIGS. 11A and 11B.

Figure 8A:
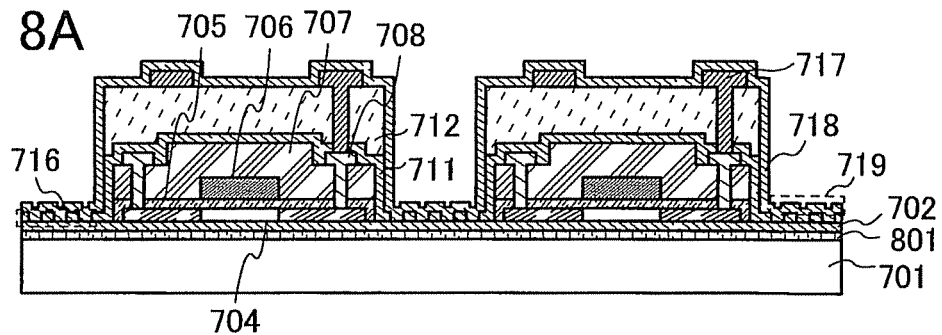
FIGS. 8A to 8D are cross-sectional views illustrating the semiconductor devices.

A cross-sectional structure of a semiconductor device illustrated in FIG. 8A is such that a separation layer 801 is additionally provided between the substrate 701 and the first inorganic insulating layer 702 in the cross-sectional structure illustrated in FIG. 7F of Embodiment 3. FIG. 8A illustrates the substrate 701, the first inorganic insulating layer 702, the semiconductor layer 704, the gate insulating layer 705, the gate electrode 706, the interlayer insulating film 707, the wiring 708, the second inorganic insulating layer 711, the organic insulating layer 712, the plurality of opening portions 716, the conductive layer 717, the third inorganic insulating layer 718, and the plurality of irregularities 719. Note that steps for stacking layers from the first inorganic insulating layer 702 to the third inorganic insulating layer 718 are similar to those in Embodiment 3; therefore, the description is not repeated in this embodiment.

The separation layer 801 is formed using a single layer or a stack of a layer that has a thickness of 30 nm to 200 nm and is formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of the above elements as its main component by a sputtering method, a plasma CVD method, a coating method, a printing method, or the like. A structure of a layer containing silicon may be amorphous, microcrystalline, or polycrystalline. Note that a coating method refers to a method in which a solution is discharged on an object to form a film, and includes, for example, a spin coating method and a droplet discharging method in its category. A droplet discharging method refers to a method in which droplets of a composition containing fine particles are discharged from a small hole to form a predetermined pattern.

When the separation layer 801 has a single-layer structure, it is preferable to form a layer containing tungsten, molybdenum, or a mixture of tungsten and molybdenum. Alternatively, a layer containing oxide or oxynitride of tungsten, a layer containing oxide or oxynitride of molybdenum, or a layer containing oxide or oxynitride of a mixture of tungsten and molybdenum may be formed. Note that a mixture of tungsten and molybdenum corresponds to an alloy of tungsten and molybdenum, for example.

When the separation layer 801 has a stacked structure, it is preferable that a metal layer be formed as a first layer and a metal oxide layer be formed as a second layer. Typically, a layer containing tungsten, molybdenum, or a mixture of tungsten and molybdenum is formed as the metal layer of the first layer. As the second layer, a layer containing oxide of tungsten, molybdenum, or a mixture of tungsten and molybdenum; nitride of tungsten, molybdenum, or a mixture of tungsten and molybdenum; oxynitride of tungsten, molybdenum, or a mixture of tungsten and molybdenum; or nitride oxide of tungsten, molybdenum, or a mixture of tungsten and molybdenum is formed.

Figure 8B:
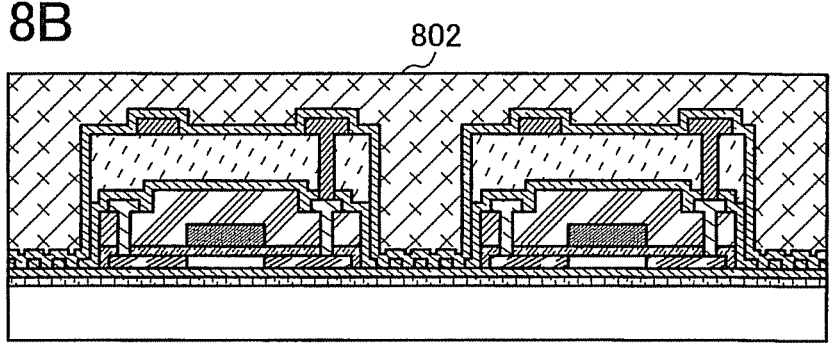
Figure 8C:
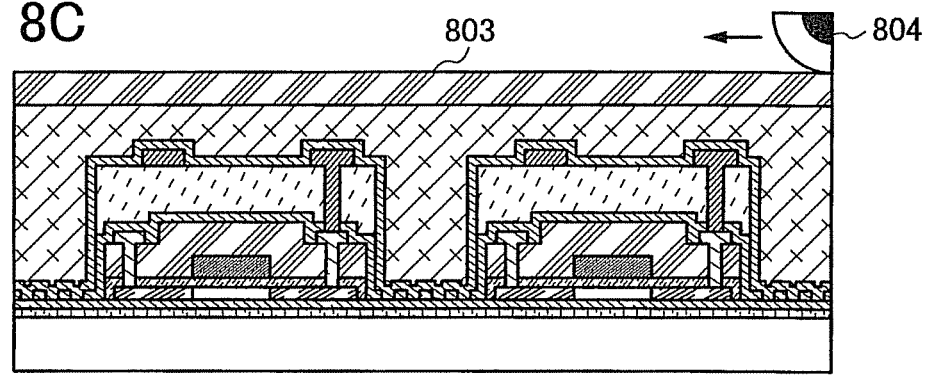
Figure 8D:
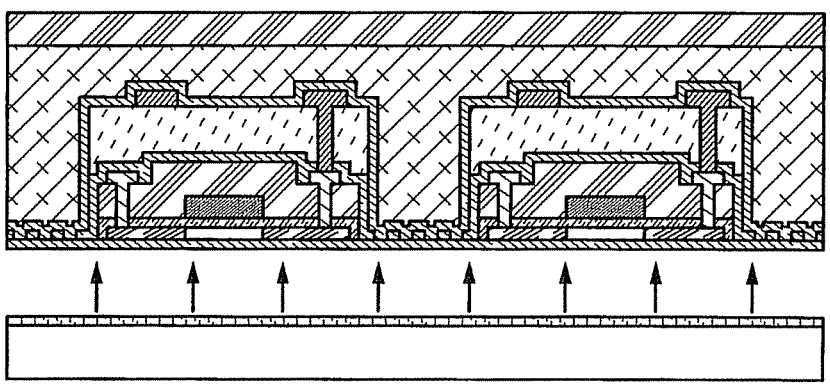

Next, after the state of FIG. 8A is obtained, a first sealing layer 802 including a fibrous body and an organic resin layer is formed over the third inorganic insulating layer 718 and the plurality of irregularities 719 and bonded by pressing (see FIG. 8B).

The first sealing layer 802 includes the fibrous body and the organic resin layer. The fibrous body is a woven fabric or a nonwoven fabric which uses a high-strength fiber of an organic compound or an inorganic compound. The high-strength fiber is specifically a fiber with a high tensile modulus of elasticity or a fiber with a high Young's modulus. Typical examples of the high-strength fiber are a polyvinyl alcohol fiber, a polyester fiber, a polyamide fiber, a polyethylene fiber, an aramid fiber, a polyparaphenylene benzobisoxazole fiber, a glass fiber, and a carbon fiber. As the glass fiber, a glass fiber using E glass, S glass, D glass, Q glass, or the like can be used. Note that the fibrous body may be formed from one kind or a plurality of the above high-strength fibers.

When a carbon fiber is used as the fibrous body so that the fibrous body is electrically conductive, electrostatic discharge can be reduced.

The fibrous body may be formed using a woven fabric which is woven using bundles of fibers (single yarn) (hereinafter referred to as yarn bundles) for warp yarns and weft yarns, or a nonwoven fabric obtained by stacking yarn bundles of plural kinds of fibers in a random manner or in one direction.

The yarn bundle may have a circular shape or an elliptical shape in cross section. As the bundle of fibers, a bundle of fibers which has been subjected to fiber opening with a high-pressure water stream, high-frequency vibration using liquid as a medium, continuous ultrasonic vibration, pressing with a roller, or the like may be used. A bundle of fibers which is subjected to fiber opening has a large width, has a smaller number of single yarns in the thickness direction, and has a cross section of an elliptical shape or a flat shape. Further, when a loosely twisted yarn is used as the bundle of fibers, the fiber bundle is easily flattened and has a cross section of an elliptical shape or a flat shape. By using a fiber bundle having a cross section of an elliptical shape or a flat shape as described above, it is possible to make the fibrous body thinner. Accordingly, the sealing layer can be made thinner, and thus, a thin semiconductor device can be manufactured. Although the diameter of the fiber bundle is preferably equal to or greater than 4 μm and equal to or less than 400 μm, more preferably equal to or greater than 4 μm and equal to or less than 200 μm, it is theoretically possible that the diameter of the fiber bundle is even smaller. Moreover, although the thickness of the fiber is preferably equal to or greater than 4 μm and equal to or less than 20 μm, it is theoretically possible that the thickness of the fiber is even smaller, and the thickness of the fiber depends on a material of the fiber.

The thickness of the first sealing layer 802 is preferably equal to or greater than 10 μm and equal to or less than 100 μm, more preferably equal to or greater than 10 μm and equal to or less than 30 μm. When the sealing layer with such a thickness is used, a thin semiconductor device capable of being bent can be formed.

As an example of a press step for bonding the first sealing layer 802 including the fibrous body and the organic resin layer to the third inorganic insulating layer 718 and the plurality of irregularities 719, the temperature is raised from a room temperature to 100° C. in 30 minutes in a vacuum atmosphere, and then, the temperature is kept at 135° C. under a pressure of 0.3 MPa for 15 minutes so that the first sealing layer 802 is uniformly fixed to the third inorganic insulating layer 718, and after that, the temperature is raised to 195° C. and kept for 60 minutes.

Next, an adhesive tape 803 which can be separated by light or heat is provided over the first sealing layer 802. Then, separation is performed at the separation layer 801 while a roller 804 rotates on the adhesive tape 803 (see FIG. 8C), so that the substrate 701 and the separation layer 801 are physically separated (see FIG. 8D).

Figure 9A:
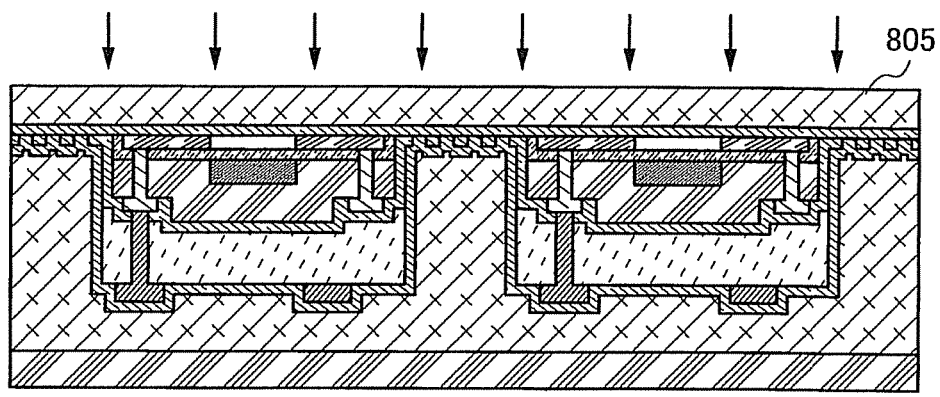
FIGS. 9A to 9C are cross-sectional views illustrating the semiconductor devices.

Next, a second sealing layer 805 including a fibrous body and an organic resin layer is formed in contact with a surface of the first inorganic insulating layer 702, which is exposed by separating the separation layer 801, and is bonded by pressing (see FIG. 9A). Note that the adhesive tape 803 may be separated before or after the second sealing layer 805 is provided.

Note that description of the second sealing layer 805 is similar to that of the first sealing layer 802; therefore, detailed description is not repeated.

Figure 9B:
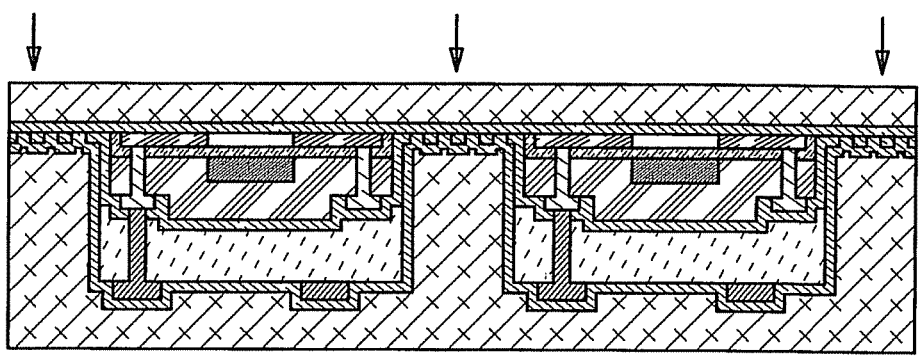

Then, laser beams (shown by arrows) are emitted to regions between elements, that is, regions provided with the plurality of opening portions 716 formed in the second inorganic insulating layer between semiconductor element layers, and chips are cut out (see FIG. 9B). Thus, a plurality of semiconductor devices 806 can be obtained (see FIG. 9C).

The above is one example of manufacturing the semiconductor device.

Figure 10:
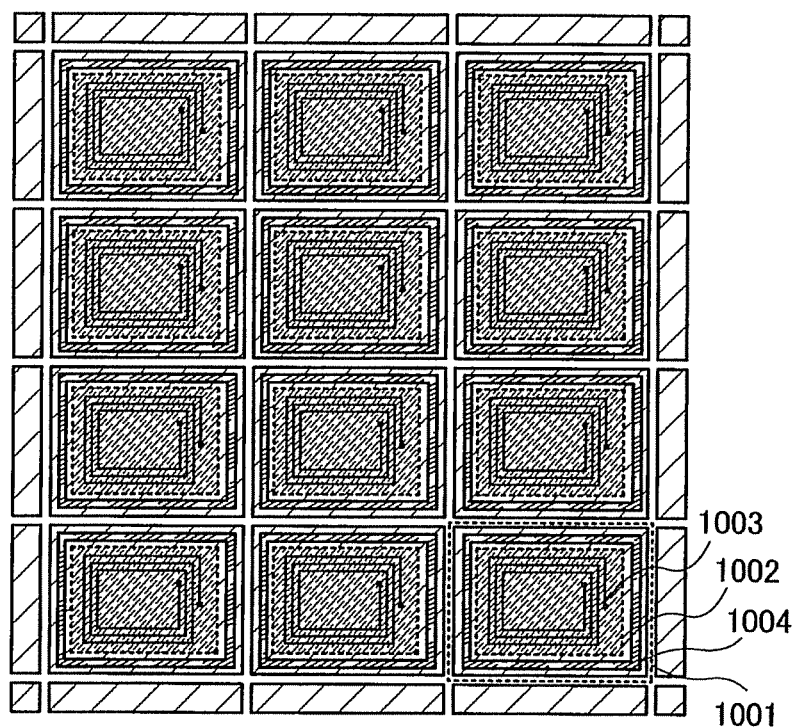
FIG. 10 is a top view illustrating semiconductor devices.

Note that the semiconductor device shown in this embodiment functions as a semiconductor device that can transmit and receive data without contact. For example, the conductive layer 717 in this embodiment functions as an antenna. Moreover, a layer including a thin film transistor having the semiconductor layer 704, the gate insulating layer 705, and the gate electrode 706, functions as a semiconductor element layer included in a logic circuit or the like. FIG. 10 is a top view in the case where a semiconductor device is formed by separating the layers including a plurality of semiconductor devices from a substrate and cutting the layers into respective semiconductor devices. Note that the top view of FIG. 10 corresponds to the cross-sectional view of FIG. 9B.

The top view of FIG. 10 illustrates, inside a sealing layer 1001, a semiconductor element layer 1002, an antenna 1003, and a region 1004 where a plurality of opening portions are formed. The region 1004 where the plurality of opening portions are formed is irradiated with laser beams, so that regions where the semiconductor element layer 1002 and the antenna 1003 are formed can be separated. As has been described in the above embodiments, the region 1004 where the plurality of opening portions are formed can improve the adhesion between the second inorganic insulating layer 711 and the third inorganic insulating layer 718, between the first inorganic insulating layer 702 and the third inorganic insulating layer 718, and between the surface of the third inorganic insulating layer 718 and the first sealing layer 802. Thus, the degree of peeling of a film at an edge portion can be reduced particularly in the preservation test under high temperature and high humidity conditions. Accordingly, moisture can be prevented from entering the semiconductor element layer 1002 and the antenna 1003 from interfaces between the first inorganic insulating layer 702 and the third inorganic insulating layer 718, between the second inorganic insulating layer 711 and the third inorganic insulating layer 718, and between the surface of the third inorganic insulating layer 718 and the first sealing layer 802. That is, a semiconductor device with improved water resistance and reliability and a method for manufacturing the semiconductor device can be provided.

Figure 9C:
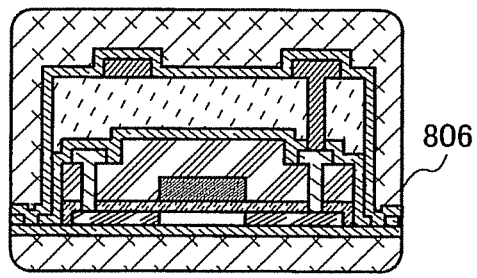
Figure 16:
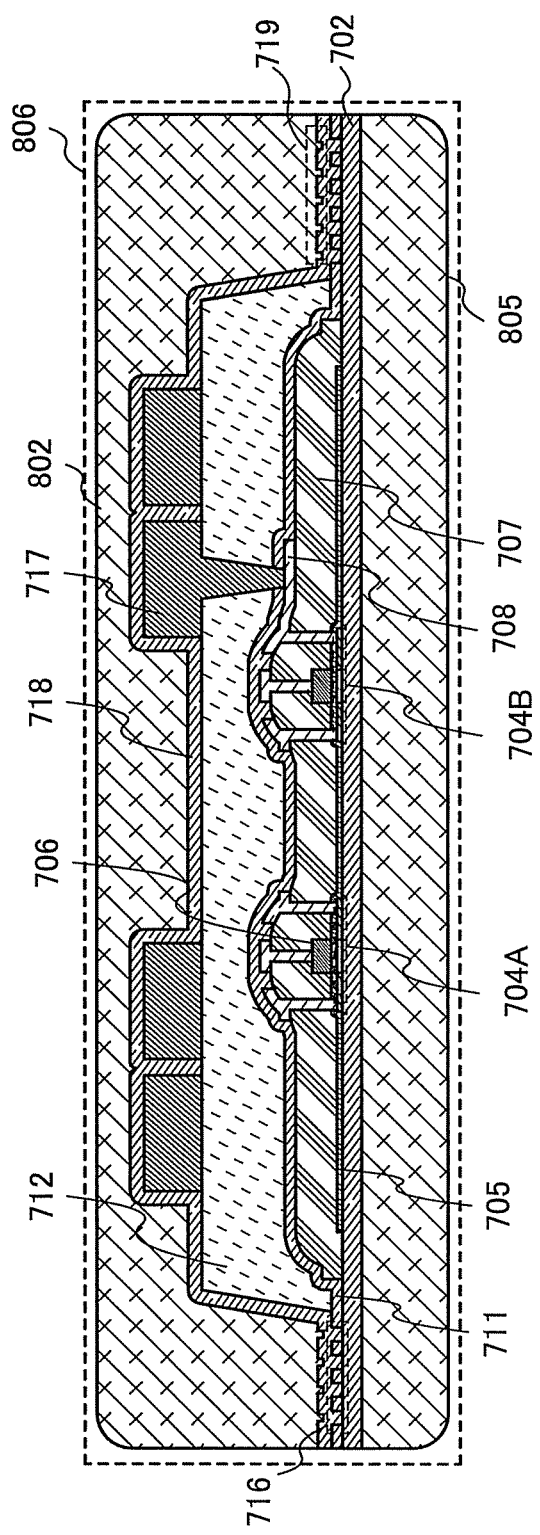
FIG. 16 is a cross-sectional view illustrating a semiconductor device.

Note that the cross-sectional view of FIG. 9C illustrates the structure in which one transistor is included as a transistor interposed between the first sealing layer 802 and the second sealing layer 805; however, the structure of the semiconductor device is not particularly limited thereto. For example, when a plurality of elements such as a p-channel transistor, an n-channel transistor, a diode, a resistor, a capacitor, and a memory element are included, the semiconductor device includes several tens of thousands of elements. As an example, FIG. 16 illustrates a structure where a p-channel transistor including a semiconductor layer 704A and an n-channel transistor including a semiconductor layer 704B are interposed between the first sealing layer 802 and the second sealing layer 805. In the semiconductor layer 704A, an element imparting p-type conductivity is added to a source region and a drain region. In the semiconductor layer 704B, an element imparting n-type conductivity is added to a source region and a drain region. Note that FIG. 16 illustrates one p-channel transistor and one n-channel transistor. In an actual semiconductor device, a plurality of p-channel transistors and n-channel transistors are placed in the lateral direction and the depth direction.

Figure 11A:
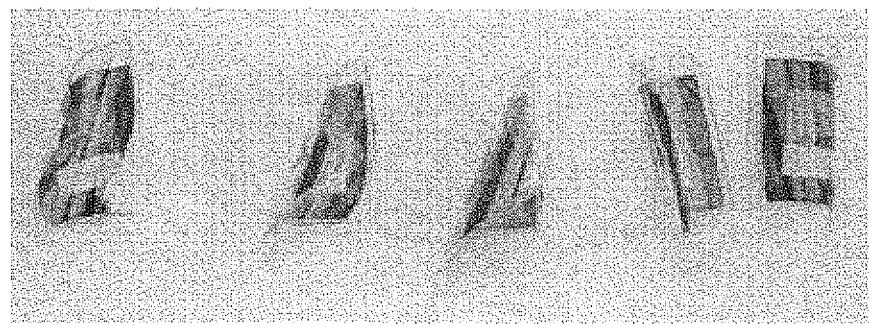
FIGS. 11A and 11B are photographs for illustrating effect of irregularities in semiconductor devices.
Figure 11B:
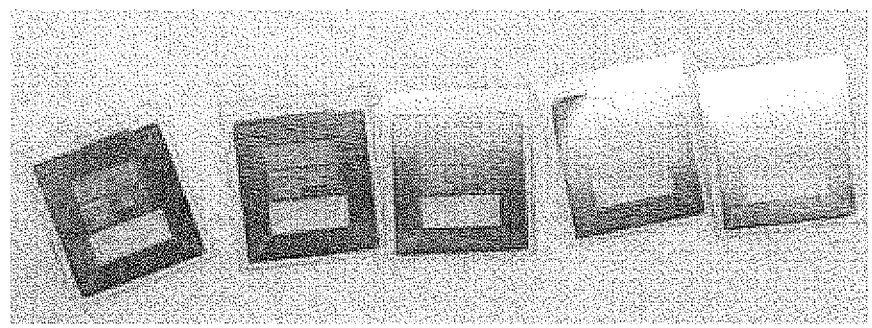

FIGS. 11A and 11B show photographs for describing effect of a plurality of opening portions in a semiconductor device. Note that FIGS. 11A and 11B are photographs of samples in which the structure described in this embodiment is experimentally reproduced. FIG. 11A shows a photograph of samples without a plurality of opening portions after the preservation test under high temperature and high humidity conditions. FIG. 11B shows a photograph of samples with a plurality of opening portions after the preservation test under high temperature and high humidity conditions. Note that since it is extremely difficult to draw the samples in FIGS. 11A and 11B by graphics, the samples are shown by the photographs instead of being drawn by the graphics.

Note that in this specification, the preservation test under high temperature and high humidity conditions refers to a test in which change after 500 hours at a temperature of 85° C. and a humidity of 85% is observed by visual inspection and an optical microscope.

It can be found from the photographs in FIGS. 11A and 11B that, in the semiconductor device with a plurality of opening portions, the degree of peeling of a film after the preservation test under high temperature and high humidity conditions can be reduced as compared to that in the semiconductor device without a plurality of opening portions (in FIG. 11A). That is, a semiconductor device with improved water resistance and reliability and a method for manufacturing the semiconductor device can be provided.

FIGS. 11A and 11B show that the provision of a plurality of opening portions is effective in reducing the degree of peeling of a film after the preservation test under high temperature and high humidity conditions. Moreover, it was found that the structure in which a silicon nitride film and a silicon oxynitride film was stacked for the first inorganic insulating layer 102 was effective in further reducing the degree of peeling of a film after the preservation test under high temperature and high humidity conditions. Further, it was also found by an optical microscope that peeling of a film after the preservation test under high temperature and high humidity conditions could be prevented by the structure in which a silicon nitride film and a silicon oxynitride film was stacked for the first inorganic insulating layer 102 and a transistor was interposed between sealing layers including a fibrous body and an organic resin layer.

Note that in this embodiment, what is illustrated in the drawing can be freely combined with or replaced with what is described in other embodiments as appropriate.

(Embodiment 5)

This embodiment will show application examples of a semiconductor device. Here, an RFID tag (also referred to as an IC tag) will be described as an application example of the semiconductor device.

Figure 12:
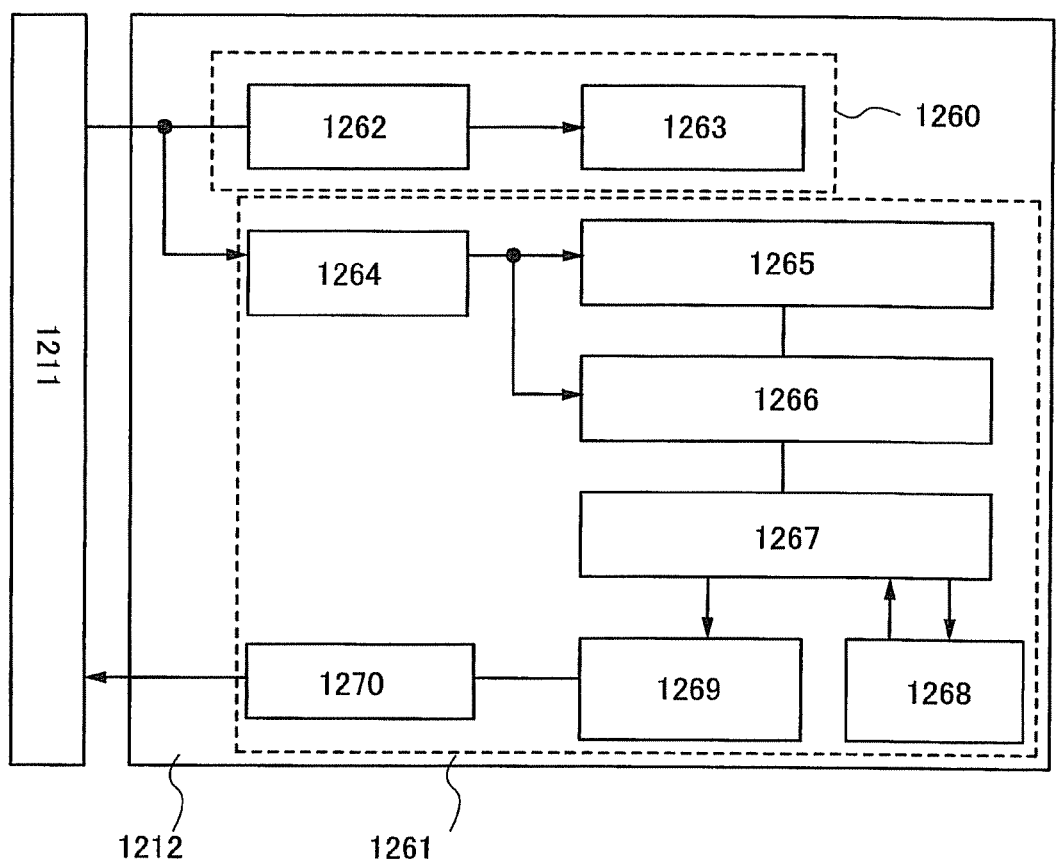
FIG. 12 is a block diagram illustrating a semiconductor device.

First, a circuit configuration example of an RFID tag to which the semiconductor device is applied will be described. FIG. 12 is a block circuit diagram of the RFID tag.

The RFID tag in FIG. 12 conforms to specifications of ISO 15693 of the International Organization for Standardization, is a vicinity type, and has a communication signal frequency of 13.56 MHz. Moreover, reception only responds to a data reading instruction, the data transmission rate in transmission is approximately 13 kHz, and the Manchester code is used for data coding.

A circuit portion 1212 of the RFID tag is roughly divided into a power supply portion 1260 and a signal processing portion 1261. The power supply portion 1260 includes a rectifier circuit 1262 and a storage capacitor 1263. Further, the power supply portion 1260 may be provided with a protection circuit portion (also referred to as a limiter circuit portion) for protecting the internal circuit when an excessive amount of electric power is received by an antenna 1211, and a protection circuit control circuit portion for controlling whether or not to operate the protection circuit portion. The provision of the circuit portions can prevent malfunction caused when the RFID tag receives a large amount of electric power under the situation in which a communication range between the RFID tag and a communication device is extremely short, for example. Accordingly, the reliability of the RFID tag can be improved. That is, the RFID tag can be normally operated without degradation of an element in the RFID tag or destruction of the RFID tag itself.

The circuit portion 1212 is formed in the semiconductor element layer 103 described in Embodiments 1 and 2.

Note that in this embodiment, a communication device has a means to transmit and receive information to/from the RFID tag by wireless communication. Examples of the communication device are a reader that reads information; a reader/writer that has a reading function and a writing function; and a mobile phone, a computer, and the like which have one or both of the read function and the write function.

The rectifier circuit 1262 rectifies a carrier wave received by the antenna 1211 and generates direct-current voltage. The storage capacitor 1263 smoothes the direct-current voltage generated in the rectifier circuit 1262. The direct-current voltage generated in the power supply portion 1260 is supplied to each circuit in the signal processing portion 1261 as power supply voltage.

The signal processing portion 1261 includes a demodulation circuit 1264, a clock generation/correction circuit 1265, a recognition/determination circuit 1266, a memory controller 1267, a mask ROM 1268, an encoding circuit 1269, and a modulation circuit 1270.

The demodulation circuit 1264 demodulates a signal received by the antenna 1211. The received signal which is demodulated by the demodulation circuit 1264 is input to the clock generation/correction circuit 1265 and the recognition/determination circuit 1266.

The clock generation/correction circuit 1265 has functions of generating a clock signal which is necessary for operating the signal processing portion 1261, and correcting the clock signal. For example, the clock generation/correction circuit 1265 includes a voltage controlled oscillator circuit (hereinafter referred to as a VCO circuit), employs an output of the VCO circuit as a feedback signal, compares phases between a supplied signal and the feedback signal, and adjusts an output signal by using negative feedback so that the signal to be input and the feedback signal have a certain phase.

The recognition/determination circuit 1266 recognizes and determines an instruction code. The instruction code recognized and determined by the recognition/determination circuit 1266 is an end-of-frame (EOF) signal, a start-of-frame (SOF) signal, a flag, a command code, a mask length, a mask value, or the like. Moreover, the recognition/determination circuit 1266 has a cyclic redundancy check (CRC) function that identifies a transmission error.

The memory controller 1267 reads data from the mask ROM 1268 in response to a signal processed by the recognition/determination circuit 1266. An ID or the like is stored in the mask ROM 1268. The mask ROM 1268 is mounted on the RFID tag, whereby the read-only RFID tag in which data is incapable of being replicated or altered is formed. When such a read-only RFID tag is embedded in paper, forgery prevention paper can be obtained.

The encoding circuit 1269 encodes the data which is read from the mask ROM 1268 by the memory controller 1267. The encoded data is modulated by the modulation circuit 1270. The data modulated by the modulation circuit 1270 is transmitted from the antenna 1211 as a carrier wave.

Next, usage examples of the RFID tag will be described. The RFID tag can be used for a variety of paper media and film media. In particular, the RFID tag having the structure described in the above embodiments can be used for a variety of paper media for which forgery prevention is necessary. Examples of the paper media are banknotes, family registers, residence certificates, passports, licenses, identification cards, membership cards, expert opinions in writing, patient's registration cards, commuter passes, promissory notes, checks, carriage notes, cargo certificates, warehouse certificates, stock certificates, bond certificates, gift certificates, tickets, and deeds of mortgage.

Further, by the RFID tag having the structure described in the above embodiments, a lot more information than that which is visually shown on a paper medium can be held in the paper medium or the film medium. Accordingly, when the RFID tag is applied to a product label or the like, development of an electronic system for merchandise management or prevention of product theft can be realized. Usage examples of the paper are described below with reference to FIGS. 13A to 13E.

FIG. 13A illustrates an example of a bearer bond 1311 using paper embedded with an RFID tag 1301. The bearer bond 1311 includes, but is not limited to, a stamp, a ticket, an admission ticket, a gift certificate, a book coupon, a stationery coupon, a beer coupon, a rice coupon, a variety of gift coupons, and a variety of service coupons in its category. Further, FIG. 13B illustrates an example of a certificate 1312 (e.g., a residence certificate or a family register) using the paper embedded with the RFID tag 1301.

FIG. 13C illustrates an example in which the RFID tag having the structure described in the above embodiments is applied to a label. Over a label base (separate paper) 1313, a label (an ID sticker) 1314 is formed using the paper embedded with the RFID tag 1301. The label 1314 is stored in a box 1315. On the label 1314, information regarding a product or a service (such as product name, brand, trademark, trademark owner, seller, or manufacturer) is printed. Moreover, a unique ID number of the product (or a category of the product) is stored in the RFID tag 1301, whereby forgery, infringement of intellectual property rights such as a trademark right or a patent right, and illegal activity such as unfair competition can be easily spotted. The RFID tag 1301 can be input with a large amount of information that cannot all be written on a container or a label of the product, such as home of the production, area of sales, quality, raw material, effect, use, quantity, shape, price, production method, usage method, time of production, time of use, expiration date, instruction manual, and intellectual property information relating to the product, for example. Accordingly, a transactor or a consumer can access such information with a simple communication device. Further, the information can be easily rewritten and erased, for example, by a producer, but cannot be rewritten and erased, for example, by the transactor or the consumer.

FIG. 13D illustrates a tag 1316 formed using paper or a film which is embedded with the RFID tag 1301. By forming the tag 1316 by using the paper or the film which is embedded with the RFID tag 1301, the tag can be manufactured at lower cost than a conventional ID tag using a plastic housing. FIG. 13E illustrates a book 1317 in which the RFID tag is used for the cover. The RFID tag 1301 is embedded in the cover.

The label 1314 or the tag 1316 provided with the RFID tag, which is an example of the semiconductor device, is attached to the product, whereby merchandise management becomes easy. For example, when the product is stolen, the perpetrator can be spotted quickly by following a route of the product. In such a manner, by using the RFID tag as an ID tag, tracking inquiry and historical management of the product's raw material, area of production, manufacturing and processing, distribution, sales, and the like are possible. That is, the product can be traceable.

Note that in this embodiment, what is illustrated in the drawing can be freely combined with or replaced with what is described in other embodiments as appropriate. That is, the present invention can provide a semiconductor device with improved water resistance and reliability and a method for manufacturing the semiconductor device.

This application is based on Japanese Patent Application serial No. 2008-109119 filed with Japan Patent Office on Apr. 18, 2008, the entire contents of which are hereby incorporated by reference.

What is claimed is:

1. A method for manufacturing a semiconductor device, comprising steps of:
    forming a first inorganic insulating layer over a substrate;
    forming a semiconductor element layer including a transistor over the first inorganic insulating layer;
    forming a first opening portion in the semiconductor element layer;
    forming a second inorganic insulating layer over the semiconductor element layer and a surface of the first inorganic insulating layer exposed by the first opening portion;
    forming an organic insulating layer over the semiconductor element layer with the second inorganic insulating layer interposed therebetween;
    forming a second opening portion in the organic insulating layer,
    forming a plurality of opening portions in parts of the second inorganic insulating layer, which are exposed by the second opening portion; and
    forming a third inorganic insulating layer over the plurality of opening portions and the organic insulating layer.

2. The method for manufacturing the semiconductor device according to claim 1, wherein each of the first inorganic insulating layer, the second inorganic insulating layer, and the third inorganic insulating layer contains one of silicon nitride and silicon nitride oxide.

3. The method for manufacturing the semiconductor device according to claim 1, wherein the transistor is a thin film transistor.

4. The method for manufacturing the semiconductor device according to claim 1, wherein the method further comprising steps of:
    forming a third opening portion in the organic insulating layer and the second inorganic insulating layer; and
    forming a conductive layer electrically connected to the semiconductor element layer in the third opening portion over the organic insulating layer.

5. The method for manufacturing the semiconductor device according to claim 1, wherein the plurality of opening portions is overlapped with the first opening portion.

6. A method for manufacturing a semiconductor device, comprising steps of:
    forming a separation layer over a substrate;
    forming a first inorganic insulating layer over the separation layer;
    forming a semiconductor element layer including a transistor over the first inorganic insulating layer,
    forming a first opening portion in the semiconductor element layer;
    forming a second inorganic insulating layer over the semiconductor element layer and a surface of the first inorganic insulating layer exposed by the first opening portion;
    foiling an organic insulating layer over the semiconductor element layer with the second inorganic insulating layer interposed therebetween;
    forming a second opening portion in the organic insulating layer,
    forming a plurality of opening portions in parts of the second inorganic insulating layer, which are exposed by the second opening portion;
    forming a third inorganic insulating layer over the plurality of opening portions and the organic insulating layer;
    forming a first sealing layer including a fibrous body and an organic resin layer, over the third inorganic insulating layer,
    separating the substrate and the separation layer;
    forming a second sealing layer on a surface of the first inorganic insulating layer exposed by the separating step; and
    cutting a region where the plurality of opening portions are provided.

7. The method for manufacturing the semiconductor device according to claim 6, wherein each of the first inorganic insulating layer, the second inorganic insulating layer, and the third inorganic insulating layer contains one of silicon nitride and silicon nitride oxide.

8. The method for manufacturing the semiconductor device according to claim 6, wherein the transistor is a thin film transistor.

9. The method for manufacturing the semiconductor device according to claim 6, wherein the method further comprising steps of:
    forming a third opening portion in the organic insulating layer and the second inorganic insulating layer, and
    forming a conductive layer electrically connected to the semiconductor element layer in the third opening portion over the organic insulating layer.

10. The method for manufacturing the semiconductor device according to claim 6, wherein the plurality of opening portions is overlapped with the first opening portion.

* * * * *

UNITED STATES PATENT AND TRADEMARK OFFICE
CERTIFICATE OF CORRECTION

PATENT NO. : 9,006,051 B2  
APPLICATION NO. : 12/423563  
DATED : April 14, 2015  
INVENTOR(S) : Yoshiaki Oikawa et al.

Page 1 of 1

It is certified that error appears in the above-identified patent and that said Letters Patent is hereby corrected as shown below:

In the Specification:

Column 15, Line 15; Change "iridium (fr)" to --iridium (Ir)--.

In the Claims:

Column 22, Line 17, Claim 6; Change "foiling" to --forming--.

Signed and Sealed this  
Third Day of November, 2015

Michelle K. Lee  
*Director of the United States Patent and Trademark Office*